(12) United States Patent
Hirose et al.

(10) Patent No.: US 10,477,679 B2
(45) Date of Patent: Nov. 12, 2019

(54) METHOD FOR PRODUCING WIRING BOARD

(71) Applicant: Toppan Forms Co., Ltd., Tokyo (JP)

(72) Inventors: Kumi Hirose, Tokyo (JP); Takuya Sekiguchi, Tokyo (JP); Nariaki Nawa, Tokyo (JP)

(73) Assignee: Toppan Forms Co., Ltd., Tokyo (JP)

( * ) Notice: Subject to any disclaimer, the term of this patent is extended or adjusted under 35 U.S.C. 154(b) by 0 days.

(21) Appl. No.: 15/864,301

(22) Filed: Jan. 8, 2018

(65) Prior Publication Data

US 2018/0153034 A1 May 31, 2018

Related U.S. Application Data

(63) Continuation of application No. 15/110,977, filed as application No. PCT/JP2015/051891 on Jan. 23, 2015, now abandoned.

(30) Foreign Application Priority Data

Jan. 24, 2014 (JP) .................................. 2014-011899

(51) Int. Cl.
*H05K 1/09* (2006.01)
*G06F 3/044* (2006.01)
(Continued)

(52) U.S. Cl.
CPC ............. *H05K 1/092* (2013.01); *G06F 3/041* (2013.01); *G06F 3/044* (2013.01); *H05K 1/0225* (2013.01);
(Continued)

(58) Field of Classification Search
CPC .... H05K 1/092; H05K 1/0225; H05K 1/0274; H05K 3/1275; H05K 2201/032;
(Continued)

(56) References Cited

U.S. PATENT DOCUMENTS 7,683,195 B2 * 3/2010 Suganuma ............... C07C 51/00
556/40
8,025,953 B2 9/2011 Lee et al.
(Continued)

FOREIGN PATENT DOCUMENTS

CN 1446028 A 10/2003
JP 2005-109351 A 4/2005
(Continued)

OTHER PUBLICATIONS

Chinese Office Action for corresponding Chinese Application No. 201580005399.5 dated Jun. 22, 2018, Partial Translation.
(Continued)

*Primary Examiner* — Brian K Talbot
(74) *Attorney, Agent, or Firm* — Hoffmann & Baron, LLP

(57) ABSTRACT

A wiring board includes: thin silver wires formed on a substrate by a printing method, in which the thin silver wires are configured so that the width thereof in a cross-section in a direction perpendicular to a wire length direction thereof is 20 μm or less, a top thereof has a smaller width than that of a contact portion that comes into contact with the substrate, and a volume resistivity of the thin silver wire is 15 μΩ·cm or less.

14 Claims, 3 Drawing Sheets

(51) Int. Cl.
*H05K 1/02* (2006.01)
*H05K 3/12* (2006.01)
*G06F 3/041* (2006.01)

(52) U.S. Cl.
CPC ......... *H05K 1/0274* (2013.01); *H05K 3/1275* (2013.01); *G06F 2203/04103* (2013.01); *G06F 2203/04112* (2013.01); *H05K 2201/032* (2013.01); *H05K 2201/098* (2013.01); *H05K 2201/09681* (2013.01)

(58) Field of Classification Search
CPC ...... H05K 2201/0968; H05K 2201/098; G06F 2203/04103; G06F 2203/04112; G06F 3/041; G06F 3/044
USPC .......................................................... 427/58
See application file for complete search history.

(56) References Cited

U.S. PATENT DOCUMENTS

| | | | |
|---|---|---|---|
| 8,168,252 B2 | 5/2012 | Okada et al. | |
| 8,323,739 B2 | 12/2012 | Sung et al. | |
| 9,371,465 B2* | 6/2016 | Hirose | C09D 11/52 |
| 9,448,672 B2 | 9/2016 | Chung et al. | |
| 9,449,734 B2 | 9/2016 | Seong et al. | |
| 9,469,773 B2* | 10/2016 | Walker | B05D 1/005 |
| 10,040,960 B2* | 8/2018 | Sekiguchi | C09D 11/52 |
| 2003/0148024 A1* | 8/2003 | Kodas | C23C 18/06 |
| | | | 427/125 |
| 2004/0214688 A1 | 10/2004 | Takasaki et al. | |
| 2005/0129304 A1* | 6/2005 | Sasazawa | G01B 11/0608 |
| | | | 382/150 |
| 2006/0130700 A1* | 6/2006 | Reinartz | B41M 5/0023 |
| | | | 106/31.92 |
| 2006/0159838 A1 | 7/2006 | Kowalski et al. | |
| 2013/0014980 A1 | 1/2013 | Takeda et al. | |
| 2013/0121872 A1* | 5/2013 | Matsumoto | C09D 11/037 |
| | | | 420/501 |
| 2013/0277096 A1 | 10/2013 | Seong et al. | |
| 2014/0152580 A1 | 6/2014 | Weaver et al. | |
| 2014/0305684 A1* | 10/2014 | Kang | C23C 18/08 |
| | | | 174/257 |
| 2014/0342084 A1 | 11/2014 | Wu et al. | |
| 2015/0008376 A1 | 1/2015 | Hirose et al. | |
| 2015/0156886 A1 | 6/2015 | Wang et al. | |
| 2015/0203699 A1* | 7/2015 | Aoki | H01B 1/22 |
| | | | 420/501 |

FOREIGN PATENT DOCUMENTS

| | | | |
|---|---|---|---|
| JP | 2007-096213 A | | 4/2007 |
| JP | 2008-047793 A | | 2/2008 |
| JP | 2009-026896 A | | 2/2009 |
| JP | 2009-114232 | * | 5/2009 |
| JP | 2009-197133 | * | 9/2009 |
| JP | 2009-238625 A | | 10/2009 |
| JP | 2010283194 A | | 12/2010 |
| JP | 2012-253172 A | | 12/2012 |
| JP | 2012-256922 A | | 12/2012 |
| WO | WO 2013/096664 | * | 6/2013 |

OTHER PUBLICATIONS

International Search Report for corresponding Application No. PCT/JP2015/051891, pp. 1-4, dated Mar. 31, 2015.

* cited by examiner

METHOD FOR PRODUCING WIRING BOARD

CROSS-REFERENCE TO RELATED APPLICATIONS

This application is a continuation of U.S. application Ser. No. 15/110,977, filed on Jul. 12, 2016, is the U.S. National Phase Application of International Application No. PCT/JP2015/051891, filed on Jan. 23, 2015, and asserts priority to Japanese Patent Application No. 2014-011899 filed on Jan. 24, 2014, all of which are hereby incorporated by reference in their entirety.

TECHNICAL FIELD

The present invention relates to a wiring board in which thin silver wires are formed on a substrate.

Priority is claimed on Japanese Patent Application No. 2014-011899, filed Jan. 24, 2014, the content of which is incorporated herein by reference.

BACKGROUND ART

A wiring board in which thin conductive wires are formed on a substrate has been widely used as a member such as a transparent electrode, an electromagnetic shield, or a touch panel in various electronic devices. Particularly, there is a rapidly increasing demand for touch panels of various display elements including information communication devices such as mobile phones, and a wiring board using a transparent substrate has become an important member.

On the other hand, as a circuit board provided with wires, a circuit board which is produced by forming a pattern using a conductive ink containing conductive particles such as, for example, silver, through a screen printing method, and performing a heating treatment thereon at a relatively low temperature of about 150° C., thereby forming a wiring pattern has been disclosed. It has also been disclosed that wires having a wire width of about 50 µm to 70 µm can be formed and thus the circuit board can be applied to the manufacturing of touch panels (refer to Patent Document 1).

However, in recent wiring boards used as touch panels or the like as described above, a wire width of about 50 µm is insufficient for wires, and for example, there is a demand for the formation of thin wires having a fine wire width of 20 µm or less. In the method disclosed in Patent Document 1, it is difficult to form such thin conductive wires, and the method would need to rely on an etching method. However, in a case of applying an etching method, the manufacturing process becomes complex, and an additional process such as wastewater disposal is necessary. Therefore, there is a problem in that the manufacturing method of the wiring board becomes complex.

CITATION LIST

Patent Literature

[Patent Document 1] Japanese Unexamined Patent Application, First Publication No. 2012-253172

SUMMARY OF INVENTION

Technical Problem

An object of the present invention is to provide a wiring board which has thin conductive wires formed therein and can be manufactured in a simple method.

Solution to Problem

In the present invention, a wiring board includes: thin silver wires formed on a substrate by a printing method, in which a width of the thin silver wires in a cross-section in a direction perpendicular to a wire length direction thereof is 20 µm or less, a top thereof has a smaller width than that of a contact portion that comes into contact with the substrate, and a volume resistivity of the thin silver wire is 15 $\Omega \cdot$cm or less.

In the wiring board of the present invention, an aspect ratio of the thin silver wires in the cross-section in the direction perpendicular to the wire length direction thereof may be 0.1 or less.

In the wiring board of the present invention, a difference in light transmittance between the wiring board and the substrate which is not provided with the thin silver wires may be 15% or less in terms of light having the same wavelength.

In the wiring board of the present invention, a thickness of the substrate may be 0.5 µm to 5000 µm.

In the wiring board of the present invention, a pitch between the thin silver wires may be 50 µm to 320 µm.

In the wiring board of the present invention, a pattern in which a plurality of the thin silver wires intersect may be provided as a pattern of the thin silver wires.

In the wiring board of the present invention, the thin silver wires may be formed by using a silver ink composition, and the silver ink composition may be produced by mixing a silver carboxylate, and a nitrogen-containing compound, with either or both of a reducing agent and an alcohol.

Advantageous Effects of Invention

The wiring board of the present invention can be produced in a simple method and is provided with thin conductive wires.

DESCRIPTION OF EMBODIMENTS

Preferred examples of a wiring board of the present invention will be described below. Here, the present invention is not limited only to the examples, and additions, omissions, substitutions, and other changes (in amount, number, position, size, and the like) can be made without departing from the gist of the present invention.

<<Wiring Board>>

A wiring board according to the present invention includes thin silver wires formed on a substrate by a printing method, in which a width of the thin silver wire in a cross-section in a direction perpendicular to a wire length direction thereof is 20 µm or less, the top thereof has a smaller width than that of a contact portion that comes into contact with the substrate, and the volume resistivity of the thin silver wire is 15 µΩ·cm or less.

Since the wire width and the volume resistivity of the thin silver wire are low and the specific shape described above is provided, the wiring board according to the present invention is appropriate as a member such as an electromagnetic shield or a touch panel in various electronic devices.

Figure 1A:
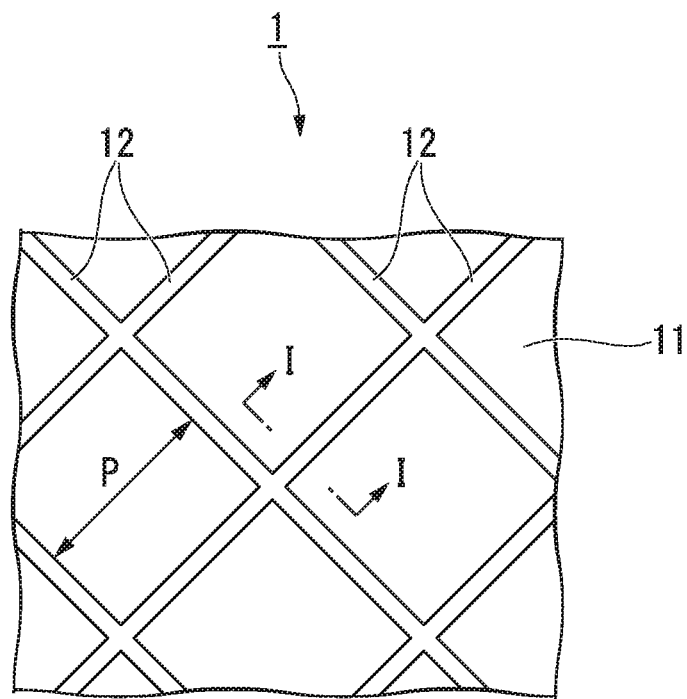
FIG. 1A is a front view schematically showing an example of a wiring board according to the present invention.
Figure 1B:
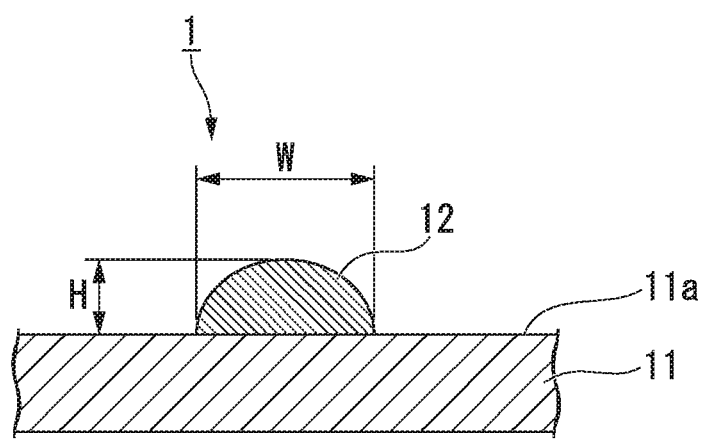
FIG. 1B is a cross-sectional view of the wiring board shown in FIG. 1A taken along line I-I.

FIG. 1A is a front view schematically showing an example of the wiring board according to the present invention, FIG. 1B is a cross-sectional view of the wiring board shown in FIG. 1A taken along line I-I (a cross-sectional view in a direction perpendicular to the wire length (longitudinal) direction of the thin silver wire).

A wiring board 1 described herein includes a plurality of straight-chained thin silver wires 12 on a surface (one principal surface) 11a of a substrate 11, and the plurality of thin silver wires 12 are arranged in parallel in two orthogonal directions and form a mesh.

<Substrate>

The substrate 11 preferably has a film shape or a sheet shape, and the thickness thereof is preferably 0.5 µm to 5000 µm, and more preferably 0.5 µm to 2500 µm.

The material of the substrate 11 is not particularly limited and may be selected depending on the purpose, and the material preferably has heat resistance so as not to be altered during the formation of the thin silver wires 12 through a heating treatment of a silver ink composition, which will be described later, and preferably has high-transmitting properties.

The material of the substrate 11 may be specifically exemplified by synthetic resins such as polyethylene (PE), polypropylene (PP), polyvinyl chloride (PVC), polyvinylidene chloride (PVDC), polymethylpentene (PMP), polycycloolefin, polystyrene (PS), polyvinyl acetate (PVAc), an acrylic resin such as polymethylmethacrylate (PMMA), an AS resin, an ABS resin, polyamide (PA), polyimide, polyamide-imide (PAI), polyacetal, polyethylene terephthalate (PET), polybutylene terephthalate (PBT), polytrimethylene terephthalate (PTT), polyethylene naphthalate (PEN), polybutylene naphthalate (PBN), polyphenylene sulfide (PPS), polysulfone (PSF), polyethersulfone (PES), polyetherketone (PEK), polyetheretherketone (PEEK), polycarbonate (PC), polyurethane, polyphenylene ether (PPE), modified polyphenylene ether (m-PPE), polyarylate, an epoxy resin, a melamine resin, a phenol resin, and a urea resin.

In addition, exemplary examples of the material of the substrate 11 are ceramics such as glass and silicon in addition to the above-mentioned materials.

In addition, the substrate 11 may be a combination of two or more materials such as a glass epoxy resin and a polymer alloy.

The substrate 11 may have a single layer or a plurality of layers including two or more layers. In a case where the substrate 11 has a plurality of layers, the plurality of layers may be the same or may be different from each other. That is, all the layers may be the same, all the layers may be different from each other, or only some of the layers may be different from each other. In addition, in the case where the plurality of layers are different from each other, the combination of the plurality of layers is not particularly limited.

Here, the sentence that the plurality of layers are different from each other means that the layers are different from each other in at least one of material and thickness.

In addition, in the case where the substrate 11 has the plurality of layers, the sum of the thicknesses of the layers may be caused to be the preferable thickness of the substrate 11.

<Thin Silver Wire>

The width W of the thin silver wire 12 in the cross-section is 20 µm or less, preferably 15 µm or less, and more preferably 13 µm or less.

In addition, the cross-sectional shape of the thin silver wire 12 is a semi-elliptical shape in which substantially the half region is cut out along a minor axis direction of an ellipse. In the present invention, in the thin silver wire 12 described above, the top has a smaller width than that of a contact portion which comes into contact with the substrate 11 in the cross-section.

Figure 2A:
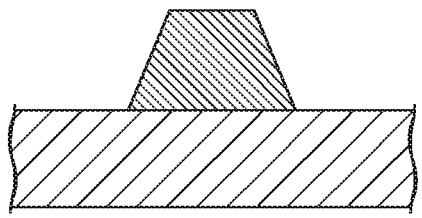
FIG. 2A is a cross-sectional view schematically showing an example of a thin silver wire having a different shape in the present invention.
Figure 2B:
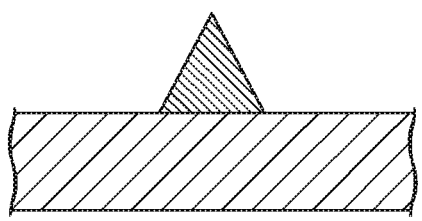
FIG. 2B is a cross-sectional view schematically showing an example of a thin silver wire having a different shape in the present invention.
Figure 2C:
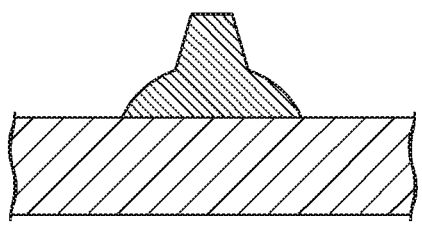
FIG. 2C is a cross-sectional view schematically showing an example of a thin silver wire having a different shape in the present invention.

In the present invention, the cross-sectional shape of the thin silver wire 12 is not limited thereto, for example, may be another shape such as a trapezoidal shape as shown in FIG. 2A, a triangular shape as shown in FIG. 2B, and a complex shape formed by combining two or more shapes as shown in FIG. 2C, and may also be a shape formed by rounding the angular portions in FIGS. 2A to 2C.

As shown in FIG. 2B, in a case where the top of the thin silver wire 12 is not a flat surface in the cross-section, the top of the thin silver wire 12 naturally has a smaller width than that of the contact portion which comes into contact with the substrate 11 (the width is zero). In addition, as shown in FIGS. 2A and 2C, in a case where the top of the thin silver wire 12 is a flat surface in the cross-section, the width of the flat surface portion has a smaller width than that of the contact portion which comes into contact with the substrate 11 of the thin silver wire 12.

Here, the cross-sectional shape of the thin silver wire 12 is bilaterally symmetric in a view directed into the figure. However, the present invention is not limited thereto, and the cross-sectional shape may not be bilaterally symmetric.

Here, the cross-section of the thin silver wire 12 is schematically shown, and the surface of the thin silver wire 12 is smooth. However, the present invention is not limited thereto, and the surface of the thin silver wire 12 may be a regularly or irregularly uneven surface.

That is, the cross-sectional shapes of the thin silver wire 12 shown in FIGS. 1A, 1B, 2A, 2B, and 2C are merely examples, and the cross-sectional shape of the thin silver wire 12 is not particularly limited as long as the features of the present invention are provided.

In the cross-section of the thin silver wire 12, a region which decreases in width as the height from the surface 11a of the substrate 11 increases preferably occupies 80% or more in the height direction of the thin silver wire 12, more preferably occupies 85% or more, even more preferably occupies 90% or more, particularly occupies 95% or more, and may occupy 100%. It is preferable that the thin silver wire 12 has such a cross-section over the entire region in the wire length direction thereof.

The thin silver wire 12 is formed by a printing method, and preferably by a gravure printing method and typically has a unique shape as described above.

Figure 3:
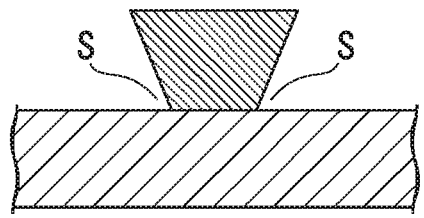
FIG. 3 is a cross-sectional view schematically showing an example of a thin silver wire formed in an etching method.

On the other hand, a thin silver wire formed by an etching method typically has an inverted trapezoidal shape as shown in FIG. 3 or an inverted trapezoidal shape close to a quadrangular shape as its cross-sectional shape.

For example, in a case of forming a coating layer (not shown) on the surface 11a of the substrate 11 so as to cover the thin silver wire 12, when the cross-sectional shape of the thin silver wire has the shape shown in FIG. 3, the coating layer cannot be formed on a region indicated by reference numeral S in the vicinity of the root portion (a contact portion that comes into contact with the substrate) of the thin silver wire, resulting in the generation of gaps. Contrary to this, when the thin silver wire 12 has the shape as shown in FIG. 1A, 1B, 2A, 2B, or 2C, the generation of gaps as described above is suppressed to a high degree. In addition, particularly in a case where the surface of the thin silver wire 12 does not have a pointed shape as shown in FIG. 1B, the structure of the coating layer can be stably held, and an effect of providing the coating layer can be maintained for a long period of time.

The ratio (H/W) of the height H to the width W, that is, aspect ratio in the cross-section of the thin silver wire 12 is preferably 0.1 or less, more preferably 0.05 or less, and particularly preferably 0.02 or less. Since the thin silver wire 12 has such a shape, the thin silver wire 12 is appropriate for a member such as an electromagnetic shield or a touch panel in various electronic devices.

The pitch P between the thin silver wires 12 (the distance between the thin silver wires 12 which are adjacent to each other) can be arbitrarily set depending on the purpose. For example, in a case where the wiring board 1 is used as a member such as an electromagnetic shield or a touch panel, the pitch therebetween is preferably 50 μm to 320 μm and more preferably 70 μm to 260 μm.

All the pitches P between the thin silver wires 12 may be the same or may be different from each other, or only some of the pitches may be different from each other. For example, the pitches P between the thin silver wires 12 may be the same or may be different from each other in two orthogonal directions.

The rate of change in the width W of the thin silver wire 12 in the wire length (longitudinal) direction ({[maximum value of W]−[minimum value of W]}/[average value of W]×100) is preferably 20% or less and more preferably 10% or less.

The thin silver wire 12 primarily contains silver metal, and the ratio of the silver metal is at a sufficiently high degree at which the thin silver wire 12 is regarded as containing only silver metal outwardly. The ratio of the silver metal in the thin silver wire 12 is preferably 99 mass % or higher. As the upper limit of the ratio of the silver metal of the thin silver wire 12, for example, any of 99.9 mass %, 99.8 mass %, 99.7 mass %, 99.6 mass %, 99.5 mass %, 99.4 mass %, 99.3 mass %, 99.2 mass %, and 99.1 mass % may be selected.

Therefore, the thin silver wire 12 may have high conductivity, and the volume resistivity of the thin silver wire 12 may be 15 Ω·cm or less, preferably 12 μΩ·cm or less, and more preferably 10 μΩ·cm or less.

The difference in light transmittance between the wiring board 1 and the substrate 11 on which the thin silver wires 12 are not formed is preferably 15% or less in terms of light having the same wavelength, more preferably 12% or less, and particularly preferably 10% or less. Since the wiring board 1 satisfies such conditions, the wiring board 1 becomes more appropriate as a member such as an electromagnetic shield or a touch panel in various electronic devices.

In the present invention, the "light transmittance of the wiring board" means light transmittance in the thickness direction of the wiring board in an arbitrary region which includes both points where the thin silver wires are formed and points where the thin silver wires are not formed (that is, the substrate) in the wiring board, and is the average light transmittance obtained from the light transmittance of a region which is influenced by the thin silver wires of the wiring board and the light transmittance of a region which is not influenced by the thin silver wires of the wiring board or approximates the average.

In the present invention, light for measuring transmittance is visible light, and the wavelength thereof is preferably 360 nm to 830 nm. The difference in light transmittance described above is obtained using light having the same wavelength.

In the present invention, the difference in light transmittance between the above-described wiring board and the substrate on which the thin silver wires are not formed (the substrate which is not influenced by the thin silver wires) reflects a reduction in light transmitting properties caused by the thin silver wires being formed. However, since the thin silver wires are fine, the difference is limited to a low value.

The wiring board 1 may be provided with, in addition to the substrate 11 and the thin silver wires 12, one or two or more other conditions in a range in which the effects of the present invention are not hindered. The other conditions may be arbitrarily selected depending on the purpose.

Here, as the wiring board, an example in which the plurality of thin silver wires are arranged in parallel in two orthogonal directions and form a mesh is described. However, the wiring board according to this embodiment is not limited thereto, and the thin silver wires may form a different pattern.

Examples of the different pattern formed by the thin silver wires include a pattern in which the angle between the plurality of thin silver wires is not 90° unlike the above description but is an angle of other than 90°, a pattern some of or all the thin silver wires are not straight-chained but are curved, and a pattern in which the plurality of thin silver wires are arranged so as not to intersect (a striped pattern such as in a case where the plurality of thin silver wires are arranged in parallel in one direction so as not to intersect each other).

The pattern of the thin silver wires included in the wiring board may have one type or two or more types. In a case where the pattern has two or more types, the combination thereof may be arbitrarily selected.

<<Production Method of Wiring Board>>

The wiring board according to the present invention can be produced by a production method having a process of forming the thin silver wires on the substrate through a printing method.

The thin silver wires may be formed by preparing a composition for forming the thin silver wires (hereinafter, sometimes abbreviated to "thin silver wire composition"), forming the pattern on the substrate using the composition through the printing method, and performing an appropriately selected post-treatment such as a drying treatment or heating (baking) treatment. The heating treatment may be performed along with the drying treatment.

In the present invention, well-known methods may be applied as the printing method. Among the methods, a gravure printing method is preferable, and a gravure offset printing method may also be applied.

A printing apparatus used in the present invention may be a well-known apparatus. For example, in the gravure printing method, a printing apparatus provided with a metallic intaglio plate having grooves which become the pattern of the thin silver wires may be used. As an offset roll, a metallic cylinder covered with a blanket material on the surface may be used. Examples of the blanket material include elastic materials such as a silicone resin, a fluororesin, a urethane resin, a synthetic rubber, and natural rubber. Among the materials, a silicone resin is particularly preferable because it has durability, high oil resistance, sufficiently high elasticity, and appropriate stiffness. The silicone resin is particularly appropriate for performing gravure offset printing on a hard substrate.

In the present invention, it is preferable that a silver ink composition into which a silver metal forming material is mixed is used as the thin silver wire composition.

The silver metal forming material has silver atoms (element) and may cause the generation of silver metal through a structural transition such as decomposition. Examples thereof include a silver salt, a silver complex, and an organo-silver compound (a compound containing a carbon to silver bond). The silver salt or silver complex may be either a silver compound having an organic group or a silver compound without an organic group. Among the materials, the silver metal forming material preferably decomposes through heating and forms silver metal, and a silver salt is preferable.

By using the silver metal forming material, silver metal is generated from the material, and thin silver wires containing the silver metal are formed. The thin silver wires in this case primarily contain the silver metal as described above and have a sufficiently high silver metal content.

It is preferable that the silver metal forming material is uniformly dispersed in the silver ink composition.

[Silver Carboxylate]

The silver metal forming material is exemplified by a silver carboxylate having a group expressed by the formula "—COOAg".

In the present invention, as the silver carboxylate, one type may be singly used, or two or more types may be used in combination. In the case of using two or more types in combination, the combination and ratio therebetween may be arbitrarily controlled.

The silver carboxylate is not particularly limited as long as it has a group expressed by the formula "—COOAg". For example, the number of groups expressed by the formula "—COOAg" may be one or two or more. In addition, the position of the group expressed by the formula "—COOAg" in the silver carboxylate is not particularly limited.

The silver carboxylate is preferably one or more types selected from the group consisting of a silver β-ketocarboxylate expressed by the following general formula (1) (hereinafter, sometimes abbreviated to "silver β-ketocarboxylate (1)") and a silver carboxylate expressed by the following general formula (4) (hereinafter, sometimes abbreviated to "silver carboxylate (4)").

In the specification, unless otherwise stated, the term "silver carboxylate" that is simply described means not only the "silver β-ketocarboxylate (1)" and the "silver carboxylate (4)" but also means "silver carboxylates having a group expressed by the formula "—COOAg"", which encompass those.

[Chem. 1]

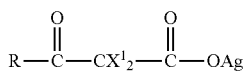

(1)

(in the formula, R is an aliphatic hydrocarbon group having 1 to 20 carbon atoms or a phenyl group in which one or more hydrogen atoms may be substituted with substituents, a hydroxyl group, an amino group, or a group expressed by the general formula "$R^1$—$CY^1_2$—", "$CY^1_3$—", "$R^1$—$CHY^1$—", "$R^2O$—", "$R^5R^4N$—", "$(R^3O)_2CY^1$—", or "$R^6$—C(=O)—$CY^1_2$—";

$Y^1$ are each independently a fluorine atom, a chlorine atom, a bromine atom, or a hydrogen atom; $R^1$ is an aliphatic hydrocarbon group having 1 to 19 carbon atoms or a phenyl group; $R^2$ is an aliphatic hydrocarbon group having 1 to 20 carbon atoms; $R^3$ is an aliphatic hydrocarbon group having 1 to 16 carbon atoms; $R^4$ and $R^5$ are each independently an aliphatic hydrocarbon group having 1 to 18 carbon atoms; $R^6$ is an aliphatic hydrocarbon group having 1 to 19 carbon atoms, a hydroxyl group, or a group expressed by the formula "AgO—";

$X^1$ are each independently a hydrogen atom, an aliphatic hydrocarbon group having 1 to 20 carbon atoms, a halogen atom, a phenyl group or a benzyl group in which one or more hydrogen atoms may be substituted with substituents, a cyano group, an N-phthaloyl-3-aminopropyl group, a 2-ethoxyvinyl group, or a group expressed by the general formula "$R^7O$—", "$R^7S$—", "$R^7$—C(=O)—", or "$R^7$—C(=O)—O—"; and $R^7$ is an aliphatic hydrocarbon group having 1 to 10 carbon atoms, a thienyl group, or a phenyl group or a diphenyl group in which one or more hydrogen atoms may be substituted with substituents.)

[Chem. 2]

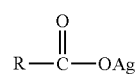

(4)

(in the formula, $R^8$ is an aliphatic hydrocarbon group having 1 to 19 carbon atoms, a carboxy group, or a group expressed by the formula "—C(=O)—OAg", and in a case where the aliphatic hydrocarbon group has methylene groups, one or more of the methylene groups may be substituted with carbonyl groups.)

(Silver β-ketocarboxylate (1))

The silver β-ketocarboxylate (1) is expressed by the general formula (1).

In the formula, R is an aliphatic hydrocarbon group having 1 to 20 carbon atoms or a phenyl group in which one or more hydrogen atoms may be substituted with substituents, a hydroxyl group, an amino group, or a group expressed by the general formula "$R^1$—$CY^1_2$—", "$CY^1_3$—", "$R^1$—$CHY^1$—", "$R^2O$—", "$R^5R^4N$—", "$(R^3O)_2CY^1$—", or "$R^6$—C(=O)—$CY^1_2$—".

The aliphatic hydrocarbon group having 1 to 20 carbon atoms in R may be straight-chained, branched-chained, or cyclic (alicyclic group). In the case of the cyclic group, the cyclic group may be either monocyclic or polycyclic. In addition, the aliphatic hydrocarbon group may be either a saturated aliphatic hydrocarbon group or an unsaturated aliphatic hydrocarbon group. In addition, the number of carbon atoms of the aliphatic hydrocarbon group is preferably 1 to 10 and more preferably 1 to 6. Examples of the preferable aliphatic hydrocarbon group in R include an alkyl group, an alkenyl group, and an alkynyl group.

Examples of the straight-chained or branched-chained alkyl group in R include a methyl group, an ethyl group, n-propyl group, an isopropyl group, an n-butyl group, an isobutyl group, a sec-butyl group, a tert-butyl group, a n-pentyl group, an isopentyl group, a neopentyl group, a tert-pentyl group, a 1-methylbutyl group, a 2-methylbutyl group, a n-hexyl group, a 1-methylpentyl group, a 2-methylpentyl group, a 3-methylpentyl group, a 4-methylpentyl group, a 1,1-dimethylbutyl group, a 2,2-dimethylbutyl group, a 3,3-dimethylbutyl group, a 2,3-dimethylbutyl group, a 1-ethylbutyl group, a 2-ethylbutyl group, a 3-ethylbutyl group, a 1-ethyl-1-methylpropyl group, an n-heptyl group, a 1-methylhexyl group, a 2-methylhexyl group, a 3-methylhexyl group, a 4-methylhexyl group, a 5-methylhexyl group, a 1,1-dimethylpentyl group, a 2,2-dimethylpentyl group, a 2,3-dimethylpentyl group, a 2,4-dimethylpentyl group, a 3,3-dimethylpentyl group, a 4,4-dimethylpentyl group, a 1-ethylpentyl group, a 2-ethylpentyl group, a 3-ethylpentyl group, a 4-ethylpentyl group, a 2,2,3-trimethylbutyl group, 1-propylbutyl group, a n-octyl group, an isooctyl group, a 1-methylheptyl group, a 2-methylheptyl group, a 3-methylheptyl group, a 4-methylheptyl group, a 5-methylheptyl group, a 1-ethylhexyl group, a 2-ethylhexyl group, a 3-ethylhexyl group, a 4-ethylhexyl group, a 5-ethylhexyl group, a 1,1-dimethylhexyl group, a 2,2-dimethylhexyl group, a 3,3-dimethylhexyl group, a 4,4-dimethylhexyl group, a 5,5-dimethylhexyl group, a 1-propylpentyl group, a 2-propylpentyl group, a nonyl group, a decyl group, a undecyl group, a dodecyl group, a tridecyl group, a tetradecyl group, a pentadecyl group, a hexadecyl group, a heptadecyl group, an octadecyl group, a nonadecyl group, and an icosyl group.

Examples of the cyclic alkyl group in R include a cyclopropyl group, a cyclobutyl group, a cyclopentyl group, a cyclohexyl group, a cycloheptyl group, a cyclooctyl group, a cyclononyl group, a cyclodecyl group, a norbornyl group, an isobornyl group, a 1-adamantyl group, a 2-adamantyl group, and a tricyclodecyl group.

Examples of the alkenyl group in R include groups in which one single bond (C—C) between carbon atoms of the alkyl group in R is substituted with a double bond (C=C), such as a vinyl group (ethenyl group, —CH=CH$_2$), an allyl group (a 2-propenyl group, —CH$_2$—CH=CH$_2$), a 1-propenyl group (—CH=CH—CH$_3$), an isopropenyl group (—C(CH$_3$)=CH$_2$), a 1-butenyl group (—CH=CH—CH$_2$—CH$_3$), a 2-butenyl group (—CH$_2$—CH=CH—CH$_3$), a 3-butenyl group (—CH$_2$—CH$_2$—CH=CH$_2$), a cyclohexenyl group, and a cyclopentenyl group.

Examples of the alkynyl group in R include groups in which one single bond (C—C) between carbon atoms of the alkyl group in R is substituted with a triple bond (C≡C), such as an ethynyl group (—C≡CH) and a propargyl group (—CH$_2$—C≡CH).

In the aliphatic hydrocarbon group having 1 to 20 carbon atoms in R, one or more hydrogen atoms may be substituted with substituents. Preferable examples of the substituents include a fluorine atom, a chlorine atom, and a bromine atom. In addition, the number of substituents and the positions thereof are not particularly limited. In a case where a plurality of substituents are included, the plurality of substituents may be the same or may be different from each other. That is, all the substituents may be the same, all the substituents may be different from each other, or only some of the substituents may be different from each other.

In the phenyl group in R, one or more hydrogen atoms may be substituted with substituents. Preferable examples of the substituents include a saturated or unsaturated monovalent aliphatic hydrocarbon group having 1 to 16 carbon atoms, a monovalent group in which the aliphatic hydrocarbon group is bonded to an oxygen atom, a fluorine atom, a chlorine atom, a bromine atom, a hydroxyl group (—OH), a cyano group (—C≡N), and a phenoxy group (—O—C$_6$H$_5$). The number of substituents and the positions thereof are not particularly limited. In a case where a plurality of substituents are included, the plurality of substituents may be the same or may be different from each other.

The aliphatic hydrocarbon group as a substituent is an exemplary example of the same aliphatic hydrocarbon group as that in R except that the number of carbon atoms is 1 to 16.

$Y^1$ in R are each independently a fluorine atom, a chlorine atom, a bromine atom, or a hydrogen atom. In addition, in each of the general formulas "$R^1$—$CY^1_2$—", "$CY^1_3$—", and "$R^6$—C(=O)—$CY^1_2$—", a plurality of $Y^1$ may be the same or may be different from each other.

$R^1$ in R is an aliphatic hydrocarbon group having 1 to 19 carbon atoms or a phenyl group (C$_6$H$_5$—), and the aliphatic hydrocarbon group in $R^1$ is an exemplary example of the same aliphatic hydrocarbon group as that in R except that the number of carbon atoms is 1 to 19.

$R^2$ in R is an aliphatic hydrocarbon group having 1 to 20 carbon atoms, and is an exemplary example of the same aliphatic hydrocarbon group as that in R.

$R^3$ in R is an aliphatic hydrocarbon group having 1 to 16 carbon atoms, and is an exemplary example of the same aliphatic hydrocarbon group as that in R except that the number of carbon atoms is 1 to 16.

$R^4$ and $R^5$ in R are each independently an aliphatic hydrocarbon group having 1 to 18 carbon atoms. That is, $R^4$ and $R^5$ may be the same or may be different from each other, and are an exemplary examples of the same aliphatic hydrocarbon group as that in R except that the number of carbon atoms is 1 to 18.

$R^6$ in R is an aliphatic hydrocarbon group having 1 to 19 carbon atoms, a hydroxyl group, or a group expressed by the formula "AgO—", and the aliphatic hydrocarbon group in $R^6$ is an exemplary example of the same aliphatic hydrocarbon group as that in R except that the number of carbon atoms is 1 to 19.

Among the groups, R is preferably the straight-chained or branched-chained alkyl group, the group expressed by the general formula "$R^6$—C(=O)—$CY^1_2$—", the hydroxyl group, or the phenyl group. In addition, $R^6$ is preferably the straight-chained or branched-chained alkyl group, the hydroxyl group, or the group expressed by the formula "AgO—".

In the general formula (1), $X^1$ are each independently a hydrogen atom, an aliphatic hydrocarbon group having 1 to 20 carbon atoms, a halogen atom, a phenyl group or a benzyl group (C$_6$H$_5$—CH$_2$—) in which one or more hydrogen atoms may be substituted with substituents, a cyano group, an N-phthaloyl-3-aminopropyl group, a 2-ethoxyvinyl group (C$_2$H$_5$—O—CH=CH—), or a group expressed by the general formula "$R^7$O—", "$R^7$S—", "$R^7$—C(=O)—", or "$R^7$—C(=O)—O—".

The aliphatic hydrocarbon group having 1 to 20 carbon atoms in $X^1$ is an exemplary example of the same aliphatic hydrocarbon group as that in R.

Examples of the halogen atom in $X^1$ include a fluorine atom, a chlorine atom, a bromine atom, and an iodine atom.

In the phenyl group and the benzyl group in $X^1$, one or more hydrogen atoms may be substituted with substituents. Preferable examples of the substituents include halogen atoms (a fluorine atom, a chlorine atom, a bromine atom, and an iodine atom) and a nitro group (—NO$_2$), and the number of substituents and the positions thereof are not particularly limited. In a case where a plurality of substituents are included, the plurality of substituents may be the same or may be different from each other.

$R^7$ in $X^1$ is an aliphatic hydrocarbon group having 1 to 10 carbon atoms, a thienyl group ($C_4H_3S$—), or a phenyl group or a diphenyl group (a biphenyl group, $C_6H_5$—$C_6H_4$—) in which one or more hydrogen atoms may be substituted with substituents. The aliphatic hydrocarbon group in $R^7$ is an exemplary example of the same aliphatic hydrocarbon group as that in R except that the number of carbon atoms is 1 to 10. In addition, examples of the substituents of the phenyl group or the diphenyl group in $R^7$ include halogen atoms (a fluorine atom, a chlorine atom, a bromine atom, and an iodine atom), and the number of substituents and the positions thereof are not particularly limited. In a case where a plurality of substituents are included, the plurality of substituents may be the same or may be different from each other.

In a case where $R^7$ is the thienyl group or the diphenyl group, a position at which $R^7$ is bonded to a group or atom (an oxygen atom, a sulfur atom, a carbonyl group, or a carbonyloxy group) adjacent to $X^1$ is not particularly limited. For example, the thienyl group may be either a 2-thienyl group or a 3-thienyl group.

In the general formula (1), two $X^1$ may be bonded as a single group to a carbon atom intermediate between two carbonyl groups via a double bond, and such a group may be exemplified by a group expressed by the formula "=CH—$C_6H_4$—$NO_2$".

Among the groups, $X^1$ are preferably a hydrogen atom, a straight-chained or branched-chained alkyl group, a benzyl group, or a group expressed by the general formula "$R^7$—C(=O)—", and at least one of $X^1$ is preferably a hydrogen atom.

The silver β-ketocarboxylate (1) is preferably silver 2-methylacetoacetate ($CH_3$—C(=O)—CH($CH_3$)—C(=O)—OAg), silver acetoacetate ($CH_3$—C(=O)—$CH_2$—C(=O)—OAg), silver 2-ethylacetoacetate ($CH_3$—C(=O)—CH($CH_2CH_3$)—C(=O)—OAg), silver propionylacetate ($CH_3CH_2$—C(=O)—$CH_2$—C(=O)—OAg), silver isobutyrylacetate (($CH_3$)$_2$CH—C(=O)—$CH_2$—C(=O)—OAg), silver pivaloylacetate (($CH_3$)$_3$C—C(=O)—$CH_2$—C(=O)—OAg), silver caproylacetate($CH_3$($CH_2$)$_3$$CH_2$—C(=O)—$CH_2$—C(=O)—OAg), silver 2-n-butylacetoacetate ($CH_3$—C(=O)—CH($CH_2CH_2CH_3$)—C(=O)—OAg), silver 2-benzylacetoacetate ($CH_3$—C(=O)—CH($CH_2$$C_6H_5$)—C(=O)—OAg), silver benzoylacetate ($C_6H_5$—C(=O)—$CH_2$—C(=O)—OAg), silver pivaloylacetoacetate (($CH_3$)$_3$C—C(=O)—$CH_2$—C(=O)—$CH_2$—C(=O)—OAg), silver isobutyrylacetoacetate (($CH_3$)$_2$CH—C(=O)—$CH_2$—C(=O)—$CH_2$—C(=O)—OAg), silver 2-acetylpivaloylacetate (($CH_3$)$_3$C—C(=O)—CH(—C(=O)—$CH_3$)—C(=O)—OAg), silver 2-acetylisobutyrylacetate (($CH_3$)$_2$CH—C(=O)—CH(—C(=O)—$CH_3$)—C(=O)—OAg), or silver acetonedicarboxylate (AgO—C(=O)—$CH_2$—C(=O)—$CH_2$—C(=O)—OAg).

With the silver β-ketocarboxylate (1), the concentration of raw materials or impurities remaining in a conductor (silver metal) formed in the post-treatment such as a drying treatment or a heating (baking) treatment may be further reduced. As the raw materials and impurities are reduced in amount, for example, contact between portions of silver metal that are formed is enhanced, and electrical conduction is easily achieved, resulting in a reduction in resistivity.

As described later, the silver β-ketocarboxylate (1) decomposes at a low temperature of preferably 60° C. to 210° C. and more preferably 60° C. to 200° C. even when a well-known reducing agent in the corresponding field is not used and can form silver metal. In addition, by also using a reducing agent, the silver β-ketocarboxylate (1) decomposes at a lower temperature and forms silver metal. The reducing agent will be described later.

In the present invention, as the silver β-ketocarboxylate (1), one type may be singly used, or two or more types may be used in combination. In the case of using two or more types in combination, the combination and ratio therebetween may be arbitrarily controlled.

(Silver Carboxylate (4))

Silver carboxylate (4) is expressed by the general formula (4).

In the formula, $R^8$ is an aliphatic hydrocarbon group having 1 to 19 carbon atoms, a carboxy group (—COOH), or a group expressed by the formula "—C(=O)—OAg".

The aliphatic hydrocarbon group in $R^8$ is an exemplary example of the same aliphatic hydrocarbon group as that in R except that the number of carbon atoms is 1 to 19. However, the number of carbon atoms of the aliphatic hydrocarbon group in $R^8$ is preferably 1 to 15, and more preferably 1 to 10.

In a case where the aliphatic hydrocarbon group in $R^8$ has methylene groups (—$CH_2$—), one or more of the methylene groups may be substituted with carbonyl groups. The number of methylene groups that may be substituted with carbonyl groups and the positions thereof are not particularly limited, and all the methylene groups may be substituted with carbonyl groups. Here, the "methylene group" includes not only a group expressed by a single formula "—$CH_2$—" but also a group expressed by one formula "—$CH_2$—" in an alkylene group in which a plurality of groups expressed by the formula "—$CH_2$—" are connected.

The silver carboxylate (4) is preferably silver pyruvate ($CH_3$—C(=O)—C(=O)—OAg), silver acetate ($CH_3$—C(=O)—OAg), silver butyrate ($CH_3$—($CH_2$)$_2$—C(=O)—OAg), silver isobutyrate (($CH_3$)$_2$CH—C(=O)—OAg), silver 2-ethylhexanoate ($CH_3$—($CH_2$)$_3$—CH($CH_2CH_3$)—C(=O)—OAg), silver neodecanoate ($CH_3$—($CH_2$)$_5$—C($CH_3$)$_2$—C(=O)—OAg), silver oxalate (AgO—C(=O)—C(=O)—OAg), silver malonate (AgO—C(=O)—$CH_2$—C(=O)—OAg). In addition, (HO—C(=O)—C(=O)—OAg, and HO—C(=O)—$CH_2$—C(=O)—OAg) synthesized by replacing one of two groups expressed by the formula "—COOAg" in each of the silver oxalate (AgO—C(=O)—C(=O)—OAg) and the silver malonate (AgO—C(=O)—$CH_2$—C(=O)—OAg) with a group expressed by the formula "—COOH" are also preferable.

Like the silver β-ketocarboxylate (1), with the silver carboxylate (4), the concentration of raw materials or impurities remaining in a conductor (silver metal) formed in the post-treatment such as a drying treatment or a heating (baking) treatment may be further reduced. In addition, by also using a reducing agent, the silver carboxylate (4) decomposes at a lower temperature and forms silver metal.

In the present invention, as the silver carboxylate (4), one type may be singly used, or two or more types may be used in combination. In the case of using two or more types in combination, the combination and ratio therebetween may be arbitrarily controlled.

The silver carboxylate is preferably one or more types selected from the group consisting of silver 2-methylacetoacetate, silver acetoacetate, silver 2-ethylacetoacetate, silver propionylacetate, silver isobutyrylacetate, silver pivaloylacetate, silver caproylacetate, silver 2-n-butylacetoacetate, silver 2-benzylacetoacetate, silver benzoylacetate, silver pivaloylacetoacetate, silver isobutyrylacetoacetate, silver acetonedicarboxylate, silver pyruvate, silver acetate, silver butyrate, silver isobutyrate, silver 2-ethylhexanoate, silver neodecanoate, silver oxalate, and silver malonate.

Among these silver carboxylates, silver 2-methylacetoacetate and silver acetoacetate have excellent compatibility with a nitrogen-containing compound (particularly an amine compound), which will be described later, and are particularly appropriate for an increase in the concentration of the silver ink composition.

In the silver ink composition, the amount of silver derived from the silver metal forming material is preferably 5 mass % or more and more preferably 10 mass % or more. In such a range, the formed conductor (silver metal) has excellent quality. The upper limit of the amount of the silver is not particularly limited as long as the effects of the present invention are not hindered, and is preferably 25 mass % in consideration of handling properties.

In the specification, unless otherwise stated, "silver derived from the silver metal forming material" means silver in the silver metal forming material mixed in during the production of the silver ink composition, and has a concept including both of silver continuously contained in the silver metal forming material after the mixing, and silver in a decomposed product produced as the silver metal forming material decomposes after the mixing and silver itself.

[Nitrogen-Containing Compound]

It is preferable that a nitrogen-containing compound is further mixed into the silver ink composition in addition to the silver metal forming material particularly in a case where the silver metal forming material is the silver carboxylate.

The nitrogen-containing compound is one or more types selected from the group consisting of an amine compound having 25 carbon atoms or less (hereinafter, sometimes abbreviated to "an amine compound"), a quaternary ammonium salt having 25 carbon atoms or less (hereinafter, sometimes abbreviated to "a quaternary ammonium salt"), ammonia, an ammonium salt produced by a reaction between an amine compound having 25 carbon atoms or less and an acid (hereinafter, sometimes abbreviated to "an ammonium salt derived from an amine compound"), and an ammonium salt produced by a reaction between ammonia and an acid (hereinafter, sometimes abbreviated to "an ammonium salt derived from ammonia"). That is, the nitrogen-containing compound mixed in may use one type or two or more types thereof. In a case of using two or more types in combination, the combination and ratio therebetween may be arbitrarily controlled.

(Amine Compound and Quaternary Ammonium Salt)

The amine compound has 1 to 25 carbon atoms and may be any of a primary amine, a secondary amine, and a tertiary amine. In addition, the quaternary ammonium salt has 4 to 25 carbon atoms. The amine compound and the quaternary ammonium salt may be either chained or cyclic. In addition, the number of nitrogen atoms included in an amine site or an ammonium salt site (for example, a nitrogen atom included in an amino group ($-NH_2$) of a primary amine) may be one or two or more.

Examples of the primary amine include monoalkylamine, monoarylamine, mono(heteroaryl)amine, and diamine, in which one or more hydrogen atoms may be substituted with substituents.

An alkyl group included in the monoalkylamine may be straight-chained, branched-chained, or cyclic, and is an exemplary example of the same alkyl group as that in R, and preferably a straight-chained or branched-chained alkyl group having 1 to 19 carbon atoms or a cyclic alkyl group having 3 to 7 carbon atoms.

Specifically, preferable examples of the monoalkylamine include n-butylamine, n-hexylamine, n-octylamine, n-dodecylamine, n-octadecylamine, sec-butylamine, tert-butylamine, isobutylamine, 3-aminopentane, 3-methylbutylamine, 2-heptylamine (2-aminoheptane), 2-aminooctane, 2-ethylhexylamine, and 1,2-dimethyl-n-propylamine.

Examples of an aryl group included in the monoarylamine include a phenyl group, a 1-naphthyl group, and a 2-naphthyl group, and the number of carbon atoms thereof is preferably 6 to 10.

A heteroaryl group included in the mono(heteroaryl)amine has a heteroatom as an atom included in the aromatic ring skeleton, and examples of the heteroatom include a nitrogen atom, a sulfur atom, an oxygen atom, a boron atom. In addition, the number of heteroatoms included in the aromatic ring skeleton is not particularly limited, and may be one or two or more. In a case of two or more heteroatoms, the heteroatoms may be the same or may be different from each other. That is, all the heteroatoms may be the same or may be different from each other, or only some thereof may be different from each other.

The heteroaryl group may be either monocyclic or polycyclic, and the number of ring members thereof (the number of atoms constituting the ring skeleton) is not particularly limited and is preferably 3 to 12.

Examples of a monocyclic heteroaryl group having 1 to 4 nitrogen atoms include a pyrrolyl group, a pyrrolinyl group, an imidazolyl group, a pyrazolyl group, a pyridyl group, a pyrimidyl group, a pyrazinyl group, a pyridazinyl group, a triazolyl group, a tetrazolyl group, a pyrrolidinyl group, an imidazolidinyl group, a piperidinyl group, a pyrazolidinyl group, and a piperazinyl group. The groups are preferably 3- to 8-membered rings, and more preferably 5- to 6-membered rings.

Examples of a monocyclic heteroaryl group having 1 oxygen atom include a furanyl group, and the group is preferably a 3- to 8-membered ring, and more preferably a 5- to 6-membered ring.

Examples of a monocyclic heteroaryl group having 1 sulfur atom include a thienyl group, and the group is preferably a 3- to 8-membered ring, and more preferably a 5- to 6-membered ring.

Examples of a monocyclic heteroaryl group having 1 to 2 oxygen atoms and 1 to 3 nitrogen atoms include an oxazolyl group, an isoxazolyl group, an oxadiazolyl group, and a morpholinyl group, and the groups are preferably 3- to 8-membered rings, and more preferably 5- to 6-membered rings.

Examples of a monocyclic heteroaryl group having 1 to 2 sulfur atoms and 1 to 3 nitrogen atoms include a thiazolyl group, a thiadiazolyl group, and a thiazolidinyl group, and the groups are preferably 3- to 8-membered rings, and more preferably 5- to 6-membered rings.

Examples of a polycyclic heteroaryl group having 1 to 5 nitrogen atoms include an indolyl group, an isoindolyl group, an indolizinyl group, a benzimidazolyl group, a quinolyl group, an isoquinolyl group, an indazolyl group, a benzotriazolyl group, a tetrazolopyridyl group, a tetrazolopyridazinyl group, and a dihydrotriazolopyridazinyl group, and the groups are preferably 7- to 12-membered rings, and more preferably 9- to 10-membered rings.

Examples of a polycyclic heteroaryl group having 1 to 3 sulfur atoms include a dithianaphthalenyl group and a benzothiophenyl group, and the groups are preferably 7- to 12-membered rings, and more preferably 9- to 10-membered rings.

Examples of a polycyclic heteroaryl group having 1 to 2 oxygen atoms and 1 to 3 nitrogen atoms include a benzoxazolyl group and a benzoxadiazolyl group, and the groups are preferably 7- to 12-membered rings, and more preferably 9- to 10-membered rings.

Examples of a polycyclic heteroaryl group having 1 to 2 sulfur atoms and 1 to 3 nitrogen atoms include a benzothiazolyl group and a benzothiadiazolyl group, and the groups are preferably 7- to 12-membered rings, and more preferably 9- to 10-membered rings.

The diamine may have two amino groups, and the positional relationship between the two amino groups is not particularly limited. Preferable examples of the diamine include those produced by replacing one hydrogen atom other than a hydrogen atom included in an amino group ($-NH_2$) in the monoalkylamine, the monoarylamine, or the mono(heteroaryl)amine with an amino group.

The diamine preferably has 1 to 10 carbon atoms, and more preferable examples thereof include ethylenediamine, 1,3-diaminopropane, and 1,4-diaminobutane.

Examples of the secondary amine include dialkylamine, diarylamine, and di(heteroaryl)amine, in which one or more hydrogen atoms may be substituted with substituents.

An alkyl group included in the dialkylamine is the same as the alkyl group included in the monoalkylamine, and is preferably a straight-chained or branched-chained alkyl group having 1 to 9 carbon atoms or a cyclic alkyl group having 3 to 7 carbon atoms. In addition, two alkyl groups in one mole of the dialkylamine may be the same or may be different from each other.

Specifically, preferable examples of the dialkylamine include N-methyl-n-hexylamine, diisobutylamine, and di(2-ethylhexyl)amine.

An aryl group included in the diarylamine is the same as the aryl group included in the monoarylamine and preferably has 6 to 10 carbon atoms. In addition, two aryl groups in one mole of the diarylamine may be the same or may be different from each other.

A heteroaryl group included in the di(heteroaryl)amine is the same as the heteroaryl group included in the mono (heteroaryl)amine and is preferably a 6- to 12-membered ring. In addition, two heteroaryl groups in one mole of the di(heteroaryl)amine may be the same or may be different from each other.

Examples of the tertiary amine include trialkylamine and dialkyl monoarylamine, in which one or more hydrogen atoms may be substituted with substituents.

An alkyl group included in the trialkylamine is the same as the alkyl group included in the monoalkylamine, and is preferably a straight-chained or branched-chained alkyl group having 1 to 19 carbon atoms or a cyclic alkyl group having 3 to 7 carbon atoms. In addition, three alkyl groups in one mole of the trialkylamine may be the same or may be different from each other. That is, all the three alkyl groups may be the same or may be different from each other, or only some thereof may be different from each other.

Specifically, preferable examples of the trialkylamine include N,N-dimethyl-n-octadecylamine, and N, N-dimethylcyclohexylamine.

An alkyl group included in the dialkyl monoarylamine is the same as the alkyl group included in the monoalkylamine, and is preferably a straight-chained or branched-chained alkyl group having 1 to 6 carbon atoms or a cyclic alkyl group having 3 to 7 carbon atoms. In addition, two alkyl groups in one mole of the dialkyl monoarylamine may be the same or may be different from each other.

An aryl group included in the dialkyl monoarylamine is the same as the aryl group included in the monoarylamine and preferably has 6 to 10 carbon atoms.

In the present invention, exemplary examples of the quaternary ammonium salt include a tetraalkylammonium halide in which one or more hydrogen atoms may be substituted with substituents.

An alkyl group included in the tetraalkylammonium halide is the same as the alkyl group included in the monoalkylamine, and preferably has 1 to 19 carbon atoms. Four alkyl groups in one mole of the tetraalkylammonium halide may be the same or may be different from each other. That is, all the four alkyl groups may be the same or may be different from each other, or only some thereof may be different from each other.

Examples of halogens included in the tetraalkylammonium halide include fluorine, chlorine, bromine, and iodine.

Specifically, preferable examples of the tetraalkylammonium halide include dodecyltrimethylammonium bromide.

Hereinabove, the chained amine compound and the organic quaternary ammonium salt have been mainly described. However, the amine compound and the quaternary ammonium salt may also be heterocyclic compounds in which a nitrogen atom included in an amine site or an ammonium salt site is a member of the ring skeleton structure (heterocyclic skeleton structure). That is, the amine compound may be a cyclic amine, and the quaternary ammonium salt may be a cyclic ammonium salt. The ring (the ring including the nitrogen atom included in the amine site or the ammonium salt site) structure at this time may be either monocyclic or polycyclic, and the number of ring members thereof (the number of atoms constituting the ring skeleton) is not particularly limited. The ring structure may be either an aliphatic ring or an aromatic ring.

A cyclic amine is preferably exemplified by pyridine.

Regarding the primary amine, the secondary amine, the tertiary amine, and the quaternary ammonium salt, "hydrogen atoms that may be substituted with substituents" are hydrogen atoms other than hydrogen atoms bonded to the nitrogen atom included in the amine site or the ammonium salt site. The number of substituents is not particularly limited and may be one or two or more. All the hydrogen atoms may also be substituted with substituents. In a case where a plurality of substituents are included, the plurality of substituents may be the same or may be different from each other. That is, all the plurality of substituents may be the same or may be different from each other, or only some thereof may be different from each other. In addition, the positions of the substituents are not particularly limited.

Examples of the substituents in the amine compound and the quaternary ammonium salt include an alkyl group, an aryl group, a halogen atom, a cyano group, a nitro group, a hydroxyl group, and a trifluoromethyl group ($-CF_3$). Here, examples of the halogen atom include a fluorine atom, a chlorine atom, a bromine atom, and an iodine atom.

In a case where an alkyl group included in the monoalkylamine has a substituent, the alkyl group is preferably a straight-chained or branched-chained alkyl group which has an aryl group as the substituent and has 1 to 9 carbon atoms, or a cyclic alkyl group which preferably has an alkyl group having 1 to 5 carbon atoms as the substituent and has 3 to 7 carbon atoms. Specific examples of a monoalkylamine having such a substituent include 2-phenylethylamine, benzylamine, and 2,3-dimethylcyclohexylamine.

In addition, in the aryl group or the alkyl group as the substituent, one or more hydrogen atoms may further be substituted with halogen atoms, and exemplary examples of the monoalkylamine having such halogen atoms as the substituents include a 2-bromobenzylamine. Here, examples of the halogen atoms include a fluorine atom, a chlorine atom, a bromine atom, and an iodine atom.

In a case where an aryl group included in the monoarylamine has a substituent, the aryl group is preferably an aryl group which has a halogen atom as the substituent and has 6 to 10 carbon atoms, and exemplary examples of the monoarylamine having such as a substituent include a bromophenylamine. Here, examples of the halogen atom include a fluorine atom, a chlorine atom, a bromine atom, and an iodine atom.

In a case where an alkyl group included in the dialkylamine has a substituent, the alkyl group is preferably a straight-chained or branched-chained alkyl group which has a hydroxyl group or an aryl group as the substituent and has 1 to 9 carbon atoms, and specific examples of a dialkylamine having such a substituent include diethanolamine and N-methylbenzylamine.

The amine compound is preferably n-propylamine, n-butylamine, n-hexylamine, n-octylamine, n-dodecylamine, n-octadecylamine, sec-butylamine, tert-butylamine, isobutylamine, 3-aminopentane, 3-methylbutylamine, 2-heptylamine, 2-aminooctane, 2-ethylhexylamine, 2-phenylethylamine, ethylenediamine, 1,3-diaminopropane, 1,4-diaminobutane, N-methyl-n-hexylamine, diisobutylamine, N-methylbenzylamine, di(2-ethylhexyl)amine, 1,2-dimethyl-n-propylamine, N,N-dimethyl-n-octadecylamine, or N,N-dimethylcyclohexylamine.

In addition, among the amine compounds, 2-ethylhexylamine, has excellent compatibility with the silver carboxylate and is particularly appropriate for an increase in the concentration of the silver ink composition. Furthermore, 2-ethylhexylamine is particularly appropriate for a reduction in the surface roughness of the thin silver wire.

(Ammonium Salt Derived from Amine Compound)

In the present invention, the ammonium salt derived from an amine compound is an ammonium salt produced by a reaction between the amine compound and an acid. The acid may be an inorganic acid such as hydrochloric acid, sulfuric acid, or nitric acid or may also be an organic acid such as acetic acid, and the type of the acid is not particularly limited.

Exemplary examples of the ammonium salt derived from an amine compound include n-propylamine hydrochloride, N-methyl-n-hexylamine hydrochloride, N,N-dimethyl-n-octadecylamine hydrochloride, or the like and is not limited thereto.

(Ammonium Salt Derived from Ammonia)

In the present invention, the ammonium salt derived from ammonia is an ammonium salt produced by a reaction between ammonia and an acid, and the acid is an exemplary example of the same acid as that in the case of the ammonium salt derived from an amine compound.

Exemplary examples of the ammonium salt derived from ammonia include ammonium chloride or the like and is not limited thereto.

In the present invention, the amine compound, the quaternary ammonium salt, the ammonium salt derived from an amine compound, and the ammonium salt derived from ammonia may be singly used in one type or may be used in a combination of two or more types. In a case of using two or more types in combination, the combination and ratio therebetween may be arbitrarily controlled.

As the nitrogen-containing compound, one type selected from the group consisting of the amine compound, the quaternary ammonium salt, the ammonium salt derived from an amine compound, and the ammonium salt derived from ammonia may be singly used, or two or more types thereof may be used in combination. In a case of using two or more types in combination, the combination and ratio therebetween may be arbitrarily controlled.

In the silver ink composition, the amount of the nitrogen-containing compound mixed in is preferably 0.3 moles to 15 moles per mole of the amount of the silver metal forming material mixed in, and is more preferably 0.3 moles to 5 moles. Since the amount of the nitrogen-containing compound mixed in is in the above range, the stability of the silver ink composition is further enhanced, and the quality of the conductor (silver metal) is further enhanced. Furthermore, even when a heating treatment is not performed at a high temperature, the conductor can be formed more stably.

[Reducing Agent]

In addition to the silver metal forming material, a reducing agent may be further mixed into the silver ink composition. By mixing the reducing agent thereinto, the silver ink composition further facilitates the formation of the silver metal. For example, a conductor (silver metal) having sufficient conductivity can be formed even in a heating treatment at a low temperature.

The reducing agent is preferably a reducing compound of one or more types (hereinafter, sometimes abbreviated to "reducing compound") selected from the group consisting of an oxalic acid, hydrazine, and a compound expressed by the following general formula (5) (hereinafter, sometimes abbreviated to "compound (5)").

$$H—C(=O)—R^{21} \quad (5)$$

(in the formula, $R^{21}$ is an alkyl group, an alkoxy group, or an N,N-dialkylamino group, each of which has 20 carbon atoms or less, a hydroxyl group, or an amino group.)

(Reducing Compound)

The reducing compound is one or more types selected from the group consisting of an oxalic acid (HOOC—COOH), hydrazine ($H_2N—NH_2$), and a compound expressed by the general formula (5) (compound (5)). That is, the reducing compound mixed in may use one type or two or more types thereof. In a case of using two or more types in combination, the combination and ratio therebetween may be arbitrarily controlled.

The alkyl group having 20 carbon atoms or less in $R^{21}$ has 1 to 20 carbon atoms, may be straight-chained, branched-chained, or cyclic, and is an exemplary example of the same alkyl group as that in R of the general formula (1).

The alkoxy group having 20 carbon atoms or less in $R^{21}$ has 1 to 20 carbon atoms, and exemplary examples of the alkoxy group include a monovalent group in which the alkyl group in $R^{21}$ is bonded to an oxygen atom.

The N,N-dialkylamino group having 20 carbon atoms or less in $R^{21}$ has 2 to 20 carbon atoms, two alkyl groups bonded to a nitrogen atom may be the same or may be different from each other, and each of the alkyl groups has 1 to 19 carbon atoms. However, the total number of carbon atoms of the two alkyl groups is 2 to 20.

The alkyl group bonded to the nitrogen atom may be straight-chained, branched-chained, or cyclic and is an exemplary example of the same alkyl group as that in R of the general formula (1) except that the number of carbon atoms is 1 to 19.

As the hydrazine as the reducing compound, monohydrate ($H_2N—NH_2.H_2O$) may be used.

Preferable examples of the reducing compound include: formic acid (H—C(=O)—OH); esters of formic acid such as methyl formate (H—C(=O)—$OCH_3$), ethyl formate (H—C(=O)—OCH$_2$CH$_3$), and butyl formate (H—C(=O)—O(CH$_2$)$_3$CH$_3$); aldehydes such as propanal (H—C(=O)—CH$_2$CH$_3$), butanal (H—C(=O)—(CH$_2$)$_2$CH$_3$), and hexanal (H—C(=O)—(CH$_2$)$_4$CH$_3$); formamides (compounds having a group expressed as the formula "H—C(=O)—N(—)—") such as formamide (H—C(=O)—NH$_2$) and N,N-dimethylformamide (H—C(=O)—N(CH$_3$)$_2$); and oxalic acid.

In the silver ink composition, the amount of the reducing agent mixed in is preferably 0.04 moles to 3.5 moles per mole of the amount of the silver metal forming material mixed in, and is more preferably 0.06 moles to 2.5 moles. Since the amount of the reducing agent is in the above range, the silver ink composition more easily and more stably facilitates the formation of the conductor (silver metal).

[Alcohol]

In addition to the silver metal forming material, an alcohol may be further mixed into the silver ink composition.

The alcohol is preferably acetylene alcohols expressed by the following general formula (2) (hereinafter, sometimes abbreviated to acetylene alcohol (2)).

[Chem. 3]

(in the formula, R' and R" are each independently an alkyl group having 1 to 20 carbon atoms, or a phenyl group in which one or more hydrogen atoms may be substituted with substituents.)

(Acetylene Alcohol (2))

The acetylene alcohol (2) is expressed by the general formula (2).

In the formula, R' and R" are each independently an alkyl group having 1 to 20 carbon atoms, or a phenyl group in which one or more hydrogen atoms may be substituted with substituents.

The alkyl group having 1 to 20 carbon atoms in R' and R" may be straight-chained, branched-chained, or cyclic. In the case of the cyclic group, the cyclic group may be either monocyclic or polycyclic. The alkyl group in R' and R" is an exemplary example of the same alkyl group as that in R.

Exemplary examples of the substituent that may replace the hydrogen atom of the phenyl group in R' and R" include a saturated or unsaturated monovalent aliphatic hydrocarbon group having 1 to 16 carbon atoms, a monovalent group in which the aliphatic hydrocarbon group is bonded to an oxygen atom, a fluorine atom, a chlorine atom, a bromine atom, a hydroxyl group, a cyano group, and a phenoxy group, and is the same as the substituent that may replace the hydrogen atom of the phenyl group in R. The number of substituents and the positions thereof are not particularly limited. In a case where a plurality of substituents are included, the plurality of substituents may be the same or may be different from each other.

R' and R" are preferably an alkyl group having 1 to 20 carbon atoms and more preferably a straight-chained or branched-chained alkyl group having 1 to 10 carbon atoms.

Preferable examples of the acetylene alcohol (2) include 3,5-dimethyl-1-hexyne-3-ol, 3-methyl-1-butyne-3-ol, and 3-methyl-1-pentyne-3-ol.

In a case of using the acetylene alcohol (2), in the silver ink composition, the amount of the acetylene alcohol (2) mixed in is preferably 0.03 moles to 0.7 moles per mole of the amount of the silver metal forming material mixed in and more preferably 0.03 moles to 0.3 moles, and may also be 0.05 moles to 0.3 moles. Since the amount of the acetylene alcohol (2) mixed in is in the above range, the stability of the silver ink composition is further enhanced.

As the alcohol, one type may be singly used, or two or more types may be used in combination. In the case of using two or more types in combination, the combination and ratio therebetween may be arbitrarily controlled.

[Other Components]

In addition to the silver metal forming material, the nitrogen-containing compound, the reducing agent, and the alcohol, other components may also be mixed into the silver ink composition.

The other components in the silver ink composition may be arbitrarily selected depending on the purpose and are not particularly limited. Preferable examples thereof include solvents other than alcohols, and the solvents may be arbitrarily selected depending on the types and amounts of the components mixed in.

The other components in the silver ink composition may use one type singly or may use two or more types in combination. In the case of using two or more types in combination, the combination and ratio therebetween may be arbitrarily controlled.

In the silver ink composition, the ratio of the amount of the other components mixed in to the total amount of the components mixed in is preferably 10 mass % or less, and more preferably 5 mass % or less. Even when the ratio thereof is 0 mass %, that is, even when the other components are not mixed therein, the silver ink composition sufficiently exhibits its effects.

In the silver ink composition, it is preferable that the silver metal forming material, the nitrogen-containing compound, and either or both of the reducing agent and the alcohol are mixed together, and it is more preferable that the silver carboxylate, the nitrogen-containing compound, and either or both of the reducing agent and the alcohol are mixed together.

In the silver ink composition, all the components mixed in may be dissolved, or some or all of the components may not be dissolved but are in a dispersed state. However, it is preferable that all the components mixed in are dissolved, and it is preferable that undissolved components are uniformly dispersed.

[Production Method of Silver Ink Composition]

The silver ink composition may be obtained by mixing the silver metal forming material with components other than the silver metal forming material. After mixing the components together, the obtained mixture may be used as the silver ink composition as it is, or the mixture subjected to subsequent well-known refining operations as necessary may be used as the silver ink composition. In the present invention, particularly in a case where the silver β-ketocarboxylate (1) is used as the silver metal forming material, during the mixing of the components, impurities that may impede conductivity are not generated or the amount of such impurities being generated can be suppressed to an extremely low amount. Therefore, even when the silver ink composition which is not subjected to the refining operations is used, a conductor (silver metal) having sufficient conductivity can be obtained.

During the mixing of the components, all the components may be added and thereafter mixed together, or some of the components may be sequentially added to be mixed therein. Otherwise, all the components may be sequentially added to be mixed together. However, in the present invention, the reducing agent is preferably mixed in by being dropped. Furthermore, by limiting a variation in dropping speed, a tendency toward a further reduction in the surface roughness of the silver metal is achieved.

The mixing method is not particularly limited, and may be appropriately selected from well-known methods including: a mixing method of rotating a stirrer, a stirring blade, or the like; a mixing method of using a mixer, a three roll mill, a kneader, a beads mill, or the like; and a mixing method of applying ultrasonic waves.

In a case of uniformly dispersing undissolved components in the silver ink composition, for example, it is preferable to apply a method of dispersing the components using the three roll mill, the kneader, the beads mill, or the like.

The temperature during the mixing is not particularly limited as long as the components mixed in are not deteriorated and is preferably −5° C. to 60° C. In addition, the temperature during the mixing may be appropriately controlled depending on the types and amounts of the components mixed in to achieve a viscosity at which the mixture obtained through the mixing is easily stirred.

In addition, the mixing time is not particularly limited as long as the components mixed in are not deteriorated and is preferably 10 minutes to 36 hours.

[Carbon Dioxide]

Carbon dioxide may be further supplied to the silver ink composition. This kind of silver ink composition achieves a high viscosity and, for example, is appropriate for thickening ink.

The carbon dioxide may be supplied at any time during the production of the silver ink composition.

In the present invention, it is preferable that the silver ink composition is produced by supplying carbon dioxide, for example, to a first mixture in which the silver metal forming material and the nitrogen-containing compound are mixed together, to obtain a second mixture, and mixing the reducing agent into the second mixture as necessary. In addition, in a case of mixing the alcohol or the other components, these may be mixed during the production of either or both of the first mixture and the second mixture, which may be arbitrarily selected depending on the purpose.

The first mixture can be produced in the same method as that of the silver ink composition except that the mixed components are different.

In the first mixture, all the components mixed in may be dissolved, or some of the components may not be dissolved but are in a dispersed state. However, it is preferable that all the components mixed in are dissolved, and it is preferable that undissolved components are uniformly dispersed.

The mixing temperature during the production of the first mixture is not particularly limited as long as the components mixed in are not deteriorated and is preferably −5° C. to 30° C. In addition, the mixing time may be appropriately controlled depending on the types of the components mixed in and the temperature during the mixing and for example, is preferably 0.5 hours to 12 hours.

Carbon dioxide ($CO_2$) supplied to the first mixture may be either in a gas state or in a solid state (dry ice) and may be in both a gas state and a solid state. It is assumed that as carbon dioxide is supplied, this carbon dioxide is dissolved in the first mixture and reacts with the components in the first mixture, resulting in an increase in the viscosity of the obtained second mixture.

Supply of carbon dioxide gas may be performed in various well-known methods in which gas is blown into a liquid, and an appropriate supply method may be appropriately selected. For example, a method in which one end of a pipe is immersed into the first mixture, the other end thereof is connected to a carbon dioxide gas supply source, and carbon dioxide gas is supplied to the first mixture through the pipe is an exemplary example.

At this time, carbon dioxide gas may be directly supplied from the end portion of the pipe. However, for example, a gas diffusion member, such as a porous member, which is provided with a number of voids which may act as gas flow paths and enables gas introduced thereinto to be diffused and emitted as fine bubbles may be connected to the end portion of the pipe and carbon dioxide gas may be supplied via the gas diffusion member. In addition, in the same method as that during the production of the first mixture, carbon dioxide gas may also be supplied while stirring the first mixture. In this manner, carbon dioxide can be efficiently supplied.

The amount of the supplied carbon dioxide gas may be appropriately controlled depending on the amount of the first mixture as a supply destination or the desired viscosity of the silver ink composition or the second mixture, and is not particularly limited. For example, in order to obtain about 100 g to 1000 g of the silver ink composition having a viscosity of 5 Pa·s or higher at 20° C. to 25° C., it is preferable to supply 100 L or more of carbon dioxide gas, and it is more preferable to supply 200 L or more thereof. Here, the viscosity of the silver ink composition at 20° C. to 25° C. has been described. However, the temperature of the silver ink composition during use is not limited to 20° C. to 25° C. and may be arbitrarily selected.

The flow rate of carbon dioxide gas may be appropriately controlled depending on the necessary supply amount of carbon dioxide gas, and is preferably 0.5 mL/min or higher and more preferably 1 mL/min or higher per 1 g of the first mixture. The upper limit of the flow rate thereof is not particularly limited and is preferably 40 mL/min per 1 g of a mixture in consideration of handling properties.

The supply time of carbon dioxide gas may be appropriately controlled in consideration of the necessary supply amount or flow rate of carbon dioxide gas.

The temperature of the first mixture during the supply of carbon dioxide gas is preferably 5° C. to 70° C., more preferably 7° C. to 60° C., and particularly preferably 10° C. to 50° C. Since the temperature is equal to or higher than the lower limit, carbon dioxide can be more efficiently supplied. Since the temperature is equal to or lower than the upper limit, the silver ink composition with a reduced amount of impurities and improved quality is obtained.

The flow rate and supply time of carbon dioxide gas and the temperature during the supply of carbon dioxide gas may be controlled to be in appropriate ranges in consideration of each of the values. For example, even when the temperature is set to a low value, carbon dioxide can be efficiently supplied by setting the flow rate of carbon dioxide gas to a high value or setting the supply time of carbon dioxide gas to a high value, or performing both the setting operations. In addition, even when the flow rate of carbon dioxide gas is set to a low value, carbon dioxide can be efficiently supplied by setting the temperature to a high value or setting the supply time of carbon dioxide gas to a high value, or performing both the setting operations. That is, by flexibly combining the numerical values in the numerical value ranges that are exemplary examples of the flow rate of carbon dioxide gas and the temperature during the supply of carbon dioxide gas in consideration of the supply time of carbon dioxide gas, the silver ink composition with good quality can be efficiently obtained.

It is preferable to supply carbon dioxide gas while stirring the first mixture. In this case, the supplied carbon dioxide gas is more uniformly dispersed in the first mixture, and the carbon dioxide can be more efficiently supplied.

The stirring method at this time may be the same as that in the case of the mixing method during the production of the silver ink composition in which carbon dioxide is not used.

Supplying of dry ice (solid carbon dioxide) may be performed by adding dry ice to the first mixture. The total amount of dry ice may be added at once, or may be divided to be added in stages (continuously with time zones during which the addition is not performed).

The amount of dry ice used may be controlled in consideration of the supply amount of carbon dioxide gas.

During the addition or after the addition of dry ice, the first mixture is preferably stirred. The first mixture is preferably stirred in the same method as that during the production of the silver ink composition in which carbon dioxide is not used. In this case, carbon dioxide can be efficiently supplied.

The temperature during the stirring may be the same as that during the supply of carbon dioxide gas. In addition, the stirring time may be appropriately controlled depending on the stirring temperature.

The viscosity of the second mixture may be appropriately controlled depending on the purpose such as a method of handling the silver ink composition or the second mixture and is not particularly limited. However, it is referable that the viscosity thereof at 20° C. to 25° C. is 3 Pa·s or higher. Here, the viscosity of the second mixture at 20° C. to 25° C. has been described. However, the temperature of the second mixture during use is not limited to 20° C. to 25° C. and may be arbitrarily selected.

The second mixture may be further mixed with one or more types selected from the group consisting of the reducing agent, the alcohol, and the other components as necessary to produce a silver ink composition.

The silver ink composition at this time may be produced in the same method as that of the silver ink composition in which carbon dioxide is not used except that the components mixed in are different. In the obtained silver ink composition, all the mixed components may be dissolved, or some of the components may not be dissolved but are in a dispersed state. However, it is preferable that all the components mixed in are dissolved, and it is preferable that undissolved components are uniformly dispersed.

The temperature during the mixing of the reducing agent is not particularly limited as long as the components mixed in are not deteriorated and is preferably −5° C. to 60° C. In addition, the temperature during the mixing may be appropriately controlled depending on the types and amounts of the components mixed in to achieve a viscosity at which the mixture obtained through the mixing is easily stirred.

In addition, the mixing time may be appropriately controlled depending on the types of the components mixed in and the temperature during the mixing and for example, is preferably 0.5 hours to 12 hours.

As described above, the other components may be mixed during the production of any one of the first mixture and the second mixture and may be mixed during the production of the two. That is, in a process of producing the silver ink composition through the first mixture and the second mixture, the ratio of the amount of the other components mixed in to the total amount of the components mixed in excluding carbon dioxide ([the other components (mass)]/[the silver metal forming material, the nitrogen-containing compound, the reducing agent, the alcohol, and the other components (mass)]×100) is preferably 10 mass % or less, and more preferably 5 mass % or less. Even when the ratio thereof is 0 mass %, that is, even when the other components are not mixed in, the silver ink composition sufficiently exhibits its effects.

The viscosity at 20° C. to 25° C. of the silver ink composition to which carbon dioxide is supplied is preferably 1 Pa·s or higher.

For example, during the mixing of the reducing agent, the obtained mixture (the silver ink composition) relatively easily generates heat. In addition, in a case where the temperature during the mixing of the reducing agent is high, the mixture enters the same state as that during the heating treatment of the silver ink composition, which will be described later. Therefore, it is assumed that the formation of silver metal from at least a portion of the silver metal forming material is started due to an action of promoting the decomposition of the silver metal forming material by the reducing agent. The silver ink composition which contains such silver metal can form a conductor during the formation of the conductor by performing a post-treatment under milder conditions than those for the silver ink composition that does not contain silver metal. In addition, in a case where the amount of the reducing agent mixed in is sufficiently high, the conductor may be formed in the same manner by performing the post-treatment under mild conditions. As described above, by employing the conditions for promoting the decomposition of the silver metal forming material, the conductor may be formed only by a drying treatment at room temperature with a heating treatment at a low temperature as the post-treatment or without a heating treatment. In addition, the silver ink composition which contains such silver metal can be handled in the same manner as that of the silver ink composition that does not contain silver metal and does not have particularly deteriorated handling properties.

In addition, the second mixture in the present invention has a higher viscosity than that in a typical case due to the supply of carbon dioxide as described above. On the other hand, during the mixing of the reducing agent of the second mixture, depending on the type of the second mixture or the reducing agent, the formation of silver metal from at least a portion of the silver metal forming material may be started and thus the silver metal is precipitated. Here, in a case where the viscosity of the second mixture is high, agglomeration of the precipitated silver metal is suppressed, and the dispersibility of the silver metal in the obtained silver ink composition is improved. The conductor obtained by using the silver ink composition has higher conductivity (has lower volume resistivity) and lower surface roughness than those of a conductor in a case where a silver ink composition obtained by mixing the reducing agent into the mixture with low viscosity, that is, the mixture to which carbon dioxide is not supplied, and has more preferable properties.

In a case where the silver ink composition adhered (printed) onto a substrate is subjected to a drying treatment, the drying treatment may be performed in a well-known method, for example, at normal pressure, at reduced pressure, or under blowing conditions and may also be performed in air or in an inert gas atmosphere. In addition, the drying temperature is not particularly limited, and either drying with heat or drying at room temperature may be employed. A drying method in air at 18° C. to 30° C. is an exemplary example of a preferable drying method in a case where the heating treatment is unnecessary.

In a case where the silver ink composition adhered onto the substrate is subjected to a heating (baking) treatment, the conditions thereof may be appropriately controlled depending on the types of the components mixed in the silver ink composition. Typically, the heating temperature is preferably 60° C. to 200° C., and more preferably 70° C. to 180° C. The heating time may be controlled depending on the heating temperature, and typically, the heating time is preferably 0.2 hours to 12 hours and more preferably 0.4 hours to 10 hours. Among silver metal forming materials, the silver carboxylate, particularly the silver β-ketocarboxylate (1) decomposes at a low temperature even when a well-known reducing agent or the like is not used, for example, unlike silver metal forming materials such as silver oxide. In addition, by reflecting this decomposition temperature, the silver ink composition can form silver metal at an extremely lower temperature than that in the related art as described above.

In a case where the silver ink composition is adhered onto a substrate having low heat resistance and is subjected to a heating (baking) treatment, the heating temperature is preferably lower than 130° C., more preferably 125° C. or lower, and particularly preferably 120° C. or lower.

A method of the heating treatment of the silver ink composition is not particularly limited, and examples thereof include heating using an electric furnace, heating using a thermosensitive type thermal head, and heating through irradiation of far-infrared radiation. In addition, the heating treatment of the silver ink composition may be performed in air, in an inert gas atmosphere, or under humidification conditions. Otherwise, the heating treatment may also be performed at normal pressure, at reduced pressure, or at a high pressure.

In the specification, unless otherwise stated, the term "humidification" means artificially increasing humidity and preferably causing a relative humidity to be 5% or higher. During the heating treatment, as the treatment temperature increases, the humidity in the treatment environment is extremely decreased. Therefore, it can be clearly said that a relative humidity of 5% is achieved by artificially increasing humidity.

In a case where the heating treatment of the silver ink composition is performed under the humidification conditions, the relative humidity is preferably 10% or higher, more preferably 30% or higher, even more preferably 50% or higher, and particularly preferably 70% or higher, may be 90% or higher, and may also be 100%. The heating treatment under the humidification conditions may also be performed by ejecting high-pressure steam heated to 100° C. or higher. By performing the heating treatment under the humidification conditions as described above, silver metal with higher purity can be formed within a short period of time.

The heating treatment of the silver ink composition may also be performed in two stages. For example, a method in which, in a first stage of the heating treatment, drying of the silver ink composition is primarily performed instead of the formation of silver metal, and in a second stage of the heating treatment, the formation of silver metal to the end is performed.

In the first stage of the heating treatment, the heating temperature may be appropriately controlled depending on the types of the components mixed in the silver ink composition, and is preferably 60° C. to 110° C. and more preferably 70° C. to 100° C. In addition, the heating time may be controlled depending on the heating temperature, and typically, the heating time is preferably 5 seconds to 12 hours and more preferably 30 seconds to 2 hours.

In the second stage of the heating treatment, the heating temperature may be appropriately controlled depending on the types of the components mixed in the silver ink composition so as to allow proper formation of silver metal, and is preferably 60° C. to 200° C. and more preferably 70° C. to 180° C. In addition, the heating time may be controlled depending on the heating temperature, and typically, the heating time is preferably 1 minute to 12 hours and more preferably 1 minute to 10 hours.

In a case where the silver ink composition is adhered onto the substrate having low heat resistance and is subjected to the heating (baking) treatment, the heating temperatures in the first and second stages of the heating treatment are preferably lower than 130° C., more preferably 125° C. or lower, and particularly preferably 120° C. or lower.

In a case where the heating treatment under the humidification conditions is employed, it is particularly preferable that the heating treatment of the silver ink composition is performed in a method with two stages in which drying of the silver ink composition is primarily performed instead of the formation of silver metal under non-humidification conditions in the first stage of the heating treatment as described above and the formation of silver metal to the end is performed under humidification conditions in the second stage of the heating treatment as described above.

In the specification, the term "non-humidification" means that "humidification" described above is not performed, that is, artificially not increasing humidity and preferably causing the relative humidity to be lower than 5%.

In a case where the heating treatment described above is performed in the method with the two stages, the heating temperature during the heating treatment under the non-humidification conditions in the first stage is preferably 60° C. to 110° C. and more preferably 70° C. to 100° C. In addition, the heating time is preferably 5 seconds to 3 hours, more preferably 30 seconds to 2 hours, and particularly preferably 30 seconds to 1 hour.

In the case where the heating treatment described above is performed in the method with the two stages, the heating temperature during the heating treatment under the humidification conditions in the second stage is preferably 60° C. to 180° C. and more preferably 70° C. to 160° C. In addition, the heating time is preferably 1 minute to 2 hours, more preferably 1 minute to 1 hour, and particularly preferably 1 minute to 30 minutes.

In the case where the silver ink composition is adhered onto the substrate having low heat resistance and is subjected to the heating (baking) treatment, the heating temperatures during the heating treatment under the non-humidification conditions in the first stage and during the heating treatment under the humidification conditions in the second stage are preferably lower than 130° C., more preferably 125° C. or lower, and particularly preferably 120° C. or lower.

In a case where a wiring board provided with, in addition to the thin silver wires formed on the substrate, other configurations is produced as the wiring board according to the present invention, processes for forming the other configurations may be appropriately added and performed at predetermined timings in the above-described production method.

EXAMPLES

Hereinafter, regarding the present invention, specific examples will be described in detail. The present invention is not limited to the examples described below.

Example 1

<Production of Silver Ink Composition>

2-ethylhexylamine (in a molar amount of 2.2 times that of silver 2-methylacetoacetate, which will be described later), 3,5-dimethyl-1-hexyne-3-ol ("Surfynol 61" made by Air Products Japan, Inc., sometimes abbreviated to "DMHO") (in a molar amount of 0.1 times that of silver 2-methylacetoacetate, which will be described later) were mixed together in a beaker, silver 2-methylacetoacetate is thereafter added thereto so as to cause the temperature of the liquid to be 25° C. or lower, and the resultant was stirred using a mechanical stirrer for 30 minutes, thereby obtaining a silver ink composition. The types and mixing ratios of the components mixed in are shown in Table 1. In Table 1, "(nitrogen-containing compound (molar ratio))" means the amount (number of moles) of a nitrogen-containing compound mixed in per mole of the amount of a silver metal forming material mixed in ([the number of moles of the nitrogen-containing compound]/[the number of moles of the silver metal forming material]). Similarly, "alcohol (molar ratio)" means the amount (number of moles) of alcohol mixed in per mole of the amount of the silver metal forming material mixed in ([the number of moles of the alcohol]/[the number of moles of the silver metal forming material]). In addition, "-" means that the corresponding component is not mixed.

<Production of Wiring Board>

Printing was performed on one primary surface (surface) of a polycarbonate substrate (with a thickness of 1 mm) using the obtained silver ink composition by a gravure offset (intaglio offset) printing method, and a mesh-like printing pattern as shown in FIG. 1A was formed. A more specific description is as follows.

As a printing apparatus, the following was used. That is, as an intaglio plate, a metallic plate that was provided with, on the surface, grooves having a width of 10 μm, which would become the pattern of thin silver wires, and had a groove pitch (the distance between the adjacent grooves) of 225 μm was used. As an offset roll, a metallic cylinder covered with a blanket material made of a silicone resin on the surface was used.

Using this printing apparatus, the silver ink composition was supplied to the intaglio plate, the extra silver ink composition was removed by a doctor blade, the silver ink composition filling the grooves was transferred onto the surface of the blanket material of the offset roll, and the silver ink composition was printed on the surface of the substrate transported by a belt conveyor unit.

Next, the obtained printing pattern was subjected to a heating (baking) treatment in an oven at 90° C. for 30 minutes to form thin silver wires on the substrate, and the resultant was used as a wiring board.

<Evaluation of Wiring Board>

Regarding the obtained wiring board, the widths and heights of the thin silver wires were measured using a shape measurement laser microscope ("VKX-100" made by Keyence Corporation). Nine silver wires were measured, and the average value thereof was calculated. Results are shown in Table 2.

Regarding the obtained wiring board, the linear resistance value R (n), cross-sectional area A (cm²), and wire length L (cm) of the thin silver wire were measured, and the volume resistivity ρ (Ω·cm) was calculated by the formula "ρ=R× A/L". In addition, the linear resistance value R was measured using a digital multimeter ("PC5000a" made by Sanwa Electric Instrument Co., Ltd.), and the cross-sectional area A was measured using a shape measurement laser microscope ("VK-X100" made by Keyence Corporation). Results are shown in Table 2.

In addition, regarding the obtained wiring board, the light transmittance was measured using a spectrophotometer ("U-3500" made by Hitachi High-Technologies Corporation). Measurement was performed on a rectangular region of 20 mm×10 mm including both formation points and non-formation points of the thin silver wires of the wiring board in a measurement wavelength range of 380 nm to 800 nm.

Example 2

<Production of Silver Ink Composition>

Silver 2-methylacetoacetate was added to 2-ethylhexylamine (in a molar amount of 1 time that of silver 2-methylacetoacetate, which will be described later) in a beaker so as to cause the temperature of the liquid to be 50° C. or lower, and the resultant was stirred using a mechanical stirrer for 15 minutes, thereby obtaining a liquid product. Formic acid (in a molar amount of 0.8 times that of silver 2-methylacetoacetate) was dropped onto the liquid product using a syringe pump for 30 minutes so as to cause the temperature of a reaction liquid to be 50° C. or lower. After the dropping of formic acid ends, the reaction liquid was further stirred for one hour at 25° C., thereby obtaining a silver ink composition. The types and mixing ratios of the components mixed in are shown in Table 1. In Table 1, "reducing agent (molar ratio)" means the amount (number of moles) of a reducing agent per mole of the amount of a silver metal forming material mixed in ([the number of moles of the reducing agent]/[the number of moles of the silver metal forming material]).

<Production and Evaluation of Wiring Board>

A wiring board was produced and evaluated in the same manner as that of Example 1 except that the obtained silver ink composition was used and printing was performed using an intaglio plate that was provided with grooves having a width of 2 μm and had a groove pitch (the distance between the adjacent grooves) of 100 μm. Results are shown in Table 2.

Example 3

<Production of Silver Ink Composition>

As shown in Table 1, a silver ink composition was obtained in the same manner as that of Example 1 except that DMHO was mixed in a molar amount of 0.05 times that of silver 2-methylacetoacetate instead of a molar amount of 0.1 times that of silver 2-methylacetoacetate.

<Production and Evaluation of Wiring Board>

A wiring board was produced and evaluated in the same manner as that of Example 1 except that the obtained silver ink composition was used, an intaglio plate having a groove pitch (the distance between the adjacent grooves) of 200 μm instead of 225 μm was used, and a printing pattern was subjected to a heating (baking) treatment in an oven at 100° C. for 30 minutes. However, a dedicated thin silver wire was formed, and the volume resistivity ρ (Ω·) of the thin silver wire was measured. That is, in addition to the printing pattern, an additional printing pattern (wide printing pattern) having a width of 200 μm and a wire length of 25 mm was simultaneously formed on the same substrate on which the above-mentioned printing pattern was formed, and the volume resistivity ρ (Ω·) of the thin silver wire formed from the wide printing pattern was measured. The wide printing pattern was used in order to improve the measurement accuracy of the volume resistivity p. Results are shown in Table 2.

Example 4

<Production of Silver Ink Composition>

As shown in Table 1, a silver ink composition was obtained in the same manner as that of Example 2 except that 2-ethylhexylamine was mixed in a molar amount of 0.4 times that of silver 2-methylacetoacetate instead of a molar amount of 1 time that of silver 2-methylacetoacetate and formic acid was mixed in a molar amount of 0.6 times that of silver 2-methylacetoacetate instead of a molar amount of 0.8 times that of silver 2-methylacetoacetate.

<Production and Evaluation of Wiring Board>

A wiring board was produced and evaluated in the same manner as that of Example 3 except that the obtained silver ink composition was used. Results are shown in Table 2.

Example 5

<Production of Silver Ink Composition>

As shown in Table 1, a silver ink composition was obtained in the same manner as that of Example 2 except that 2-ethylhexylamine was mixed in a molar amount of 0.5 times that of silver 2-methylacetoacetate instead of a molar amount of 1 time that of silver 2-methylacetoacetate, isobutylamine was mixed in a molar amount of 0.5 times that of silver 2-methylacetoacetate, and formic acid was mixed in a molar amount of 0.6 times that of silver 2-methylacetoacetate instead of a molar amount of 0.8 times that of silver 2-methylacetoacetate.

<Production and Evaluation of Wiring Board>

A wiring board was produced and evaluated in the same manner as that of Example 3 except that the obtained silver ink composition was used and an intaglio plate having a groove width of 7 μm instead of 10 μm was used. Results are shown in Table 2.

Example 6

<Production of Silver Ink Composition>

As shown in Table 1, a silver ink composition was obtained in the same manner as that of Example 2 except that 2-ethylhexylamine was mixed in a molar amount of 0.9 times that of silver 2-methylacetoacetate instead of a molar amount of 1 time that of silver 2-methylacetoacetate, isobutylamine was mixed in a molar amount of 0.1 times that of silver 2-methylacetoacetate, and formic acid was mixed in a molar amount of 0.6 times that of silver 2-methylacetoacetate instead of a molar amount of 0.8 times that of silver 2-methylacetoacetate.

<Production and Evaluation of Wiring Board>

A wiring board was produced and evaluated in the same manner as that of Example 3 except that the obtained silver ink composition was used. Results are shown in Table 2.

Example 7

<Production of Silver Ink Composition>

Silver 2-methylacetoacetate was added to 2-ethylhexylamine (in a molar amount of 1.5 times that of silver 2-methylacetoacetate, which will be described later) in a beaker so as to cause the temperature of the liquid to be 50° C. or lower, and the resultant was stirred using a mechanical stirrer for 15 minutes, thereby obtaining a liquid product. Formic acid (in a molar amount of 0.4 times that of silver 2-methylacetoacetate) was dropped onto the liquid product using a syringe pump for 30 minutes so as to cause the temperature of a reaction liquid to be 50° C. or lower. After the dropping of formic acid ends, the reaction liquid was further stirred for one hour at 25° C., DMHO (in a molar amount of 0.04 times that of silver 2-methylacetoacetate) was thereafter added to the resultant while a temperature of 25° C. was maintained, and the reaction liquid was further stirred for about two minutes, thereby obtaining a silver ink composition. The types and mixing ratios of the components mixed in are shown in Table 1.

<Production and Evaluation of Wiring Board>

A wiring board was produced and evaluated in the same manner as that of Example 1 except that the obtained silver ink composition was used, an intaglio plate having a groove width of 5 μm instead of 10 μm was used, and a printing pattern was subjected to a heating (baking) treatment in an oven at 100° C. for 10 minutes and was further subjected to a heating (baking) treatment at 100° C. for 10 minutes under humidification conditions instead of the heating (baking) treatment in an oven at 90° C. for 30 minutes. Similar to the case of Example 3, a dedicated thin silver wire was formed, and the volume resistivity ρ (Ω·cm) of the thin silver wire was measured. Results are shown in Table 2.

Example 8

<Production of Silver Ink Composition>

Silver 2-methylacetoacetate was added to a mixture of 2-ethylhexylamine (in a molar amount of 1.3 times that of silver 2-methylacetoacetate, which will be described later) and isobutylamine (in a molar amount of 0.2 times that of silver 2-methylacetoacetate, which will be described later) in a beaker so as to cause the temperature of the liquid to be 50° C. or lower, and the resultant was stirred using a mechanical stirrer for 15 minutes, thereby obtaining a liquid product. Formic acid (in a molar amount of 0.4 times that of silver 2-methylacetoacetate) was dropped onto the liquid product using a syringe pump for 30 minutes so as to cause the temperature of a reaction liquid to be 50° C. or lower. After the dropping of formic acid ends, the reaction liquid was further stirred for one hour at 25° C., DMHO (in a molar amount of 0.04 times that of silver 2-methylacetoacetate) was thereafter added to the resultant while a temperature of 25° C. was maintained, and the reaction liquid was further stirred for about two minutes, thereby obtaining a silver ink composition. The types and mixing ratios of the components mixed in are shown in Table 1.

<Production and Evaluation of Wiring Board>

A wiring board was produced and evaluated in the same manner as that of Example 7 except that the obtained silver ink composition was used. Results are shown in Table 2.

Example 9

<Production of Silver Ink Composition>

Silver 2-methylacetoacetate was added to a mixture of 2-ethylhexylamine (in a molar amount of 1.3 times that of silver 2-methylacetoacetate, which will be described later), isobutylamine (in a molar amount of 0.2 times that of silver 2-methylacetoacetate, which will be described later), and n-butylamine (in a molar amount of 0.05 times that of silver 2-methylacetoacetate, which will be described later) in a beaker so as to cause the temperature of the liquid to be 50° C. or lower, and the resultant was stirred using a mechanical stirrer for 15 minutes, thereby obtaining a liquid product. Formic acid (in a molar amount of 1 time that of silver 2-methylacetoacetate) was dropped onto the liquid product using a syringe pump for 30 minutes so as to cause the temperature of a reaction liquid to be 50° C. or lower. After the dropping of formic acid ends, the reaction liquid was further stirred for one hour at 25° C., thereby obtaining a silver ink composition. The types and mixing ratios of the components mixed in are shown in Table 1.

<Production and Evaluation of Wiring Board>

A wiring board was produced and evaluated in the same manner as that of Example 7 except that the obtained silver ink composition was used. Results are shown in Table 2.

Example 10

<Production of Silver Ink Composition>

Silver 2-methylacetoacetate was added to a mixture of 2-ethylhexylamine (in a molar amount of 1.3 times that of silver 2-methylacetoacetate, which will be described later) and isobutylamine (in a molar amount of 0.2 times that of silver 2-methylacetoacetate, which will be described later) in a beaker so as to cause the temperature of the liquid to be 50° C. or lower, and the resultant was stirred using a mechanical stirrer for 15 minutes, thereby obtaining a liquid product. Formic acid (in a molar amount of 0.4 times that of silver 2-methylacetoacetate) was dropped onto the liquid product using a syringe pump for 30 minutes so as to cause the temperature of a reaction liquid to be 50° C. or lower. After the dropping of formic acid ends, the reaction liquid was further stirred for one hour at 25° C., 3-methyl-1-butyne-3-ol (2-methyl-3-butyne-2-ol, "Olfine B" made by Nissin Chemical Co., Ltd., hereinafter, sometimes abbreviated to "MBO") (in a molar amount of 0.04 times that of silver 2-methylacetoacetate) was thereafter added to the resultant while a temperature of 25° C. was maintained, and the reaction liquid was further stirred for about two minutes, thereby obtaining a silver ink composition. The types and mixing ratios of the components mixed in are shown in Table 1.

<Production and Evaluation of Wiring Board>

A wiring board was produced and evaluated in the same manner as that of Example 7 except that the obtained silver ink composition was used. Results are shown in Table 2.

Example 11

<Production of Silver Ink Composition>

As shown in Table 1, a silver ink composition was obtained in the same manner as that of Example 2 except that silver acetoacetate was used instead of silver 2-methylacetoacetate, and formic acid was mixed in a molar amount of 1 time that of silver acetoacetate instead of a molar amount of 0.8 times that of silver 2-methylacetoacetate.

<Production and Evaluation of Wiring Board>

A wiring board was produced and evaluated in the same manner as that of Example 3 except that the obtained silver ink composition was used, a printing pattern was subjected to a heating (baking) treatment in an oven at 100° C. for 10 minutes and was further subjected to a heating (baking) treatment at 100° C. for 10 minutes under humidification conditions. Results are shown in Table 2.

Example 12

<Production of Silver Ink Composition>

Silver acetoacetate was added to a mixture of 2-ethylhexylamine (in a molar amount of 1.3 times that of silver acetoacetate, which will be described later), isobutylamine (in a molar amount of 0.2 times that of silver acetoacetate, which will be described later), and n-butylamine (in a molar amount of 0.05 times that of silver acetoacetate, which will be described later) in a beaker so as to cause the temperature of the liquid to be 50° C. or lower, and the resultant was stirred using a mechanical stirrer for 15 minutes, thereby obtaining a liquid product. Formic acid (in a molar amount of 1 time that of silver acetoacetate) was dropped onto the liquid product using a syringe pump for 30 minutes so as to cause the temperature of a reaction liquid to be 50° C. or lower. After the dropping of formic acid ends, the reaction liquid was further stirred for one hour at 25° C., DMHO (in a molar amount of 0.04 times that of silver acetoacetate) was thereafter added to the resultant while a temperature of 25° C. was maintained, and the reaction liquid was further stirred for about two minutes, thereby obtaining a silver ink composition. The types and mixing ratios of the components mixed in are shown in Table 1.

<Production and Evaluation of Wiring Board>

A wiring board was produced and evaluated in the same manner as that of Example 7 except that the obtained silver ink composition was used. Results are shown in Table 2.

Example 13

<Production of Silver Ink Composition>

As shown in Table 1, a silver ink composition was obtained in the same manner as that of Example 2 except that silver acetonedicarboxylate was used instead of silver 2-methylacetoacetate, and formic acid was mixed in a molar amount of 1 time that of silver acetonedicarboxylate instead of a molar amount of 0.8 times that of silver 2-methylacetoacetate.

<Production and Evaluation of Wiring Board>

A wiring board was produced and evaluated in the same manner as that of Example 3 except that the obtained silver ink composition was used, a printing pattern was subjected to a heating (baking) treatment in an oven at 100° C. for 10 minutes and was further subjected to a heating (baking) treatment at 100° C. for 10 minutes under humidification conditions. Results are shown in Table 2.

Comparative Example 1

There was an attempt to produce and evaluate a wiring board in the same manner as that of Example 3 except that a commercially available gravure offset silver paste described below was used as a silver ink composition. Results are shown in Table 2.

(Gravure Offset Silver Paste)

A silver paste which contains silver metal particles and a binder and has a viscosity of 2.5 Pa·s (the same as that of the silver ink composition of Example 10) at a shear rate of 1000/s at 25° C.

Comparative Example 2

A wiring board was produced and evaluated in the same manner as that of Example 3 using the same gravure offset silver paste as that of Comparative Example 1 as a silver ink composition except that an intaglio plate having a groove width of 15 μm instead of 10 μm was used. Results are shown in Table 2.

TABLE 1

| | Components mixed in silver ink composition | | | |
|---|---|---|---|---|
| | Silver metal forming material | Nitrogen-containing compound (molar ratio) | Reducing agent (molar ratio) | Alcohol (molar ratio) |
| Example 1 | Silver 2-methylacetoacetate | 2-Ethylhexylamine (2.2) | — | DMHO(0.1) |
| Example 2 | Silver 2-methylacetoacetate | 2-Ethylhexylamine (1) | Formic acid (0.8) | — |
| Example 3 | Silver 2-methylacetoacetate | 2-Ethylhexylamine (2.2) | — | DMHO(0.05) |
| Example 4 | Silver 2-methylacetoacetate | 2-Ethylhexylamine (0.4) | Formic acid (0.6) | — |
| Example 5 | Silver 2-methylacetoacetate | 2-Ethylhexylamine (0.5) Isobutylamine (0.5) | Formic acid (0.6) | — |
| Example 6 | Silver 2-methylacetoacetate | 2-Ethylhexylamine (0.9) Isobutylamine (0.1) | Formic acid (0.6) | — |
| Example 7 | Silver 2-methylacetoacetate | 2-Ethylhexylamine (1.5) | Formic acid (0.4) | DMHO(0.04) |
| Example 8 | Silver 2-methylacetoacetate | 2-Ethylhexylamine (1.3) Isobutylamine (0.2) | Formic acid (0.4) | DMHO(0.04) |
| Example 9 | Silver 2-methylacetoacetate | 2-Ethylhexylamine (1.3) Isobutylamine (0.2) n-Butylamine (0.05) | Formic acid (1) | — |
| Example 10 | Silver 2-methylacetoacetate | 2-Ethylhexylamine (1.3) Isobutylamine (0.2) | Formic acid (0.4) | MBO(0.04) |
| Example 11 | Silver acetoacetate | 2-Ethylhexylamine (1) | Formic acid (1) | — |
| Example 12 | Silver acetoacetate | 2-Ethylhexylamine (1.3) Isobutylamine (0.2) n-Butylamine (0.05) | Formic acid (1) | DMHO(0.04) |
| Example 13 | Silver acetonedicarboxylate | 2-Ethylhexylamine (1) | Formic acid (1) | — |
| Comparative Example 1 | Commercially available silver paste | | | |
| Comparative Example 2 | Commercially available silver paste | | | |

TABLE 2

| | Thin silver wire | | | |
|---|---|---|---|---|
| | Width (μm) | Height (μm) | Aspect ratio | Volume resistivity (μΩ·cm) |
| Example 1 | 12.578 | 0.174 | 0.014 | 15 |
| Example 2 | 2.737 | 0.051 | 0.019 | 8 |
| Example 3 | 12.0 | 0.11 | 0.009 | 14 |
| Example 4 | 11.0 | 0.12 | 0.011 | 6 |
| Example 5 | 8.9 | 0.08 | 0.009 | 8 |
| Example 6 | 12.5 | 0.07 | 0.006 | 7 |
| Example 7 | 6.0 | 0.07 | 0.012 | 10 |
| Example 8 | 5.8 | 0.07 | 0.012 | 9 |
| Example 9 | 7.0 | 0.08 | 0.011 | 7 |
| Example 10 | 5.8 | 0.08 | 0.014 | 10 |
| Example 11 | 12.0 | 0.09 | 0.008 | 11 |
| Example 12 | 7.8 | 0.10 | 0.012 | 15 |
| Example 13 | 12.0 | 0.08 | 0.007 | 15 |
| Comparative Example 1 | — | — | — | — |
| Comparative Example 2 | 17.5 | 0.9 | 0.051 | 32 |

As is apparent from the results, thin silver wires having a small wire width, a small aspect ratio, and a small volume resistivity could be formed by the gravure offset printing method using the silver ink composition.

In addition, the light transmittance of the wiring board was 87% or higher in all wavelength ranges in Example 1 and was 85% or higher in all wavelength ranges in Example 2. On the other hand, the light transmittance of a polycarbonate substrate, which was the same as those used in Examples 1 and 2 and was not provided with thin silver wires, was similarly measured, and was 90% or higher in all wavelength ranges. In addition, the difference in light transmittance between the wiring board and the polycarbonate substrate which was not provided with thin silver wires was, in a case where calculation was performed using light having the same wavelength, in all wavelength ranges, 3.3% or lower in Example 1 and 6.5% or lower in Example 2, which means that there was a slight reduction in the light transmittance caused by the formation of the thin silver wires. That is, it could be confirmed that the wiring boards of Examples 1 and 2 were useful as a member such as an electromagnetic shield or a touch panel.

Similar to Examples 1 and 2, Examples 3 to 13 satisfy the condition that the difference in light transmittance between the wiring board and the polycarbonate substrate which was not provided with thin silver wires was, in a case where calculation was performed using light having the same wavelength, in all wavelength ranges, 15% or lower, and it could be confirmed that there was a slight reduction in the light transmittance caused by the formation of the thin silver wires, and the wiring boards were useful as a member such as an electromagnetic shield or a touch panel.

As described above, the wiring board in which the thin silver wire had a small wire width, a small aspect ratio, and a small volume resistivity, and higher light transmittance was achieved could be obtained in a simple method.

On the other hand, in Comparative Example 1, since the silver paste was used, a large number of short circuits were formed in the printing pattern, and desired thin silver wires could not be formed. In Table 2, "-" means that evaluation of the corresponding item could not be performed.

A production method of the wiring board of Comparative Example 2 was the same as a production method of the wiring board of Comparative Example 1 except that the groove width of the intaglio plate was 15 μm instead of 10 μm. Since the groove width of the intaglio plate was increased, thin silver wires could be formed. However, the volume resistivity of the thin silver wires was increased.

INDUSTRIAL APPLICABILITY

The present invention can be used for members in various electronic devices, such as an electromagnetic shield or a touch panel.

REFERENCE SIGNS LIST 1 wiring board
11 substrate
11a surface of substrate (one primary surface)
12 thin silver wire
W width of thin silver wire
H height of thin silver wire
P pitch between thin silver wires

What is claimed is:

1. A method for producing a wiring board, comprising:
producing a silver ink composition by mixing a silver carboxylate and a nitrogen-containing compound with a reducing agent, and then adding an alcohol thereto, and forming thin silver wires on a substrate by a printing method using the silver ink composition to form a wiring board,
wherein a width of the thin silver wire in a cross-section in a direction perpendicular to a wire length direction thereof is 15 μm or less, and a top thereof has a smaller width than that of a contact portion that comes into contact with the substrate,
an aspect ratio of the thin silver wire in the cross-section in the direction perpendicular to the wire length direction thereof is 0.1 or less, and the reducing agent is mixed with the silver carboxylate and the nitrogen-containing compound by being dropped thereon.

2. The method according to claim 1, wherein the silver carboxylate is a silver 2-methylacetoacetate, a silver acetoacetate, or a silver acetone dicarboxylate.

3. The method according to claim 1, wherein the nitrogen-containing compound is at least one selected from the group consisting of an amine compound having 1 to 25 carbon atoms, a quaternary ammonium salt having 4 to 25 carbon atoms, an ammonia, an ammonium salt produced by a reaction between an amine compound having 1 to 25 carbon atoms and an acid, and an ammonium salt produced by a reaction between an ammonia and an acid.

4. The method according to claim 3, wherein at least one of the nitrogen-containing compound is a 2-ethylhexylamine.

5. The method according to claim 1, wherein the printing method is a gravure printing method or a gravure offset printing method.

6. The method according to claim 1, wherein a thickness of the substrate is 0.5 μm to 5000 μm.

7. The method according to claim 1, wherein a pitch between the thin silver wires is 50 μm to 320 μm.

8. The method according to claim 1, further comprising: providing a pattern in which a plurality of the thin silver wires intersect as a pattern of the thin silver wires.

9. The method according to claim 1, further comprising heating the thin silver wires at lower than 130° C.

10. The method according to claim 2, further comprising heating the thin silver wires at 60° C. to 100° C.

11. The method according to claim 2, wherein the silver carboxylate is a silver 2-methylacetoacetate.

12. The method according to claim 1, wherein the reducing agent is a formic acid.

13. The method according to claim 1, further comprising heating the thin silver wires on the substrate in two stages, wherein a first stage is performed at 70° C. to 100° C. under non-humidification conditions and a second stage is performed at 70° C. to 160° C. under humidification conditions.

14. The method according to claim 13, wherein the second stage is performed at 70° C. to 120° C. under humidification conditions.

* * * * *

UNITED STATES PATENT AND TRADEMARK OFFICE
CERTIFICATE OF CORRECTION

PATENT NO. : 10,477,679 B2
APPLICATION NO. : 15/864301
DATED : November 12, 2019
INVENTOR(S) : Hirose et al.

Page 1 of 1

It is certified that error appears in the above-identified patent and that said Letters Patent is hereby corrected as shown below:

In the Specification

Column 5, Line 52:  now reads "15 Ω·cm"
should read --15 µΩ·cm--

Column 23, Line 32:  now reads "it is referable"
should read --it is preferable--

Signed and Sealed this
Eleventh Day of August, 2020

Andrei Iancu
*Director of the United States Patent and Trademark Office*